United States Patent [19]

Schlecht et al.

[11] Patent Number: 5,396,527

[45] Date of Patent: Mar. 7, 1995

[54] RECOVERED ENERGY LOGIC CIRCUITS

[75] Inventors: Martin F. Schlecht, Lexington; Roderick T. Hinman, Natick, both of Mass.

[73] Assignee: Massachusetts Institute of Technology, Cambridge, Mass.

[21] Appl. No.: 272,300

[22] Filed: Jul. 8, 1994

Related U.S. Application Data

[63] Continuation-in-part of Ser. No. 916,343, Jul. 17, 1992, abandoned.

[51] Int. Cl.[6] ............................................. G11C 19/28
[52] U.S. Cl. ..................................... 377/57; 257/235; 331/117 R; 327/530; 327/544; 327/284; 326/93
[58] Field of Search .......................... 377/57; 257/235; 307/246, 607; 331/117 R

[56] References Cited

U.S. PATENT DOCUMENTS

| | | | |
|---|---|---|---|
| 3,651,334 | 3/1972 | Thompson et al. | 307/208 |
| 4,190,778 | 2/1980 | Krause | 307/254 |
| 4,996,454 | 2/1991 | Peczalski et al. | 307/480 |

OTHER PUBLICATIONS

Boysel, Lee L. et al., "Four-Phase LSI Logic Offers New Approach to Computer Designer," *Computer Design,* Apr. 1970, pp. 141–146.

Yang, Long et al., "High Speed Dynamic Circuits Implemented with GaAs Mesfets,", *IEEE,* 1987, GaAs IC Symposium, pp. 261–263.

Lu, Shih-Lien, "A Safe Single-Phase Clocking Scheme for CMOS Circuits," *IEEE Journal of Solid-State Circuits,* vol. 23, No. 1, Feb. 1988, pp. 280–283.

Seitz, Charles L. et al., "Hot-Clock nMOS," Department of Computer Science, California Institute of Technology, Pasadena, 1985 Chapel Hill Conference on VLSI, pp. 1–17.

Yap, Jee-Hoon, Bachelor's Thesis, "Low Power Digital Circuits Using AC-Power," Submitted to the Dept. of Electrical Engineering and Computer Science, Massachusetts Institute of Technology.

Titow, W. A., "Transistorlogik mit Wechselstrom," NACHRICHTENTECHNIK, vol. 20, No. 5, May 1970, Berlin, pp. 171–179.

Patent Abstracts of Japan, vol. 3, No. 156 (E–161) 21 Dec. 1979, (Matsushita Dengi Sangyo K.K.) 26 Oct. 1979.

Hinman, Roderick, "Recovered Energy Logic: A Logic Family and Powr Supply Featuring Very High Efficiency," Doctoral Thesis, Massachusetts Institute of Technology, May 1994, pp. 1–231.

Ji-Ren, Yuan et al., "A True Single-Phase-Clock Dynamic CMOS Circuit Technique," *IEEE Journal of Solid-State Circuits,* vol. SC–22, No. 5, Oct. 1987, pp. 899–901.

(List continued on next page.)

*Primary Examiner*—Margaret Rosenwambach
*Attorney, Agent, or Firm*—Hamilton, Brook, Smith & Reynolds

[57] ABSTRACT

A logic circuit is driven by a single alternating voltage power supply so that the energy stored in parasitic capacitances can be mostly recovered, rather than dissipated, as in conventional logic designs. Successive stages of the logic circuit are of opposite conductivity types such that the successive stages are activated in alternate half cycles of the power supply without separate clock signals. Each stage of the logic circuit is precharged during a respective first half cycle of the power supply and is active in logical processing during a second half cycle. The half cycles are defined by the rising and falling edges of the power supply. The logic circuit resonates with an inductor coupled across the power supply but closely coupled to the logic circuit. This inductor and the method of charging and discharging the capacitors in the logic circuit serve to minimize the power dissipated during logical processing.

57 Claims, 20 Drawing Sheets

OTHER PUBLICATIONS

Yuan, Jiren et al., "High-Speed CMOS Circuit Technique," *IEEE Journal of Solid-State Circuits*, vol. 24, No. 1, Feb. 1989, pp. 62–70.

Afghahi, Morteza et al., "A Unified Single-Phase Clocking Scheme for VLSI Systems," *IEEE Journal of Solid-State Circuits*, vol. 25, No. 1, Feb. 1990, pp. 225–231.

Penney, *MOS Integrated Circuits*, Von Nostrand 1972, pp. 265–289.

Patel, D. C., "Novel design of the output stage for four-phase dynamic VLSI logic," *Microelectronics Journal*, vol. 15, No. 3 1984 Benn Electrnoics Publications Ltd, Luton, pp. 12–17.

Glasser & Dobberpuhl, *The Design & Analysis of VLSI Circuits*, Addison-Wesley, 1985, p. 61.

Teggatz, Ross E., "A Power-Efficient 32-Bit Electroluminesecent Display Column Driver," Society for Information Display, International Symp., Digest of Technical Papers, vol. XX, Playa del Rey, Calif., 1989, pp. 68–70.

Svensson, K. "J", et al., Adiabatic charging without inductors, University of Southern California, Information Sciences Institute, Marina del Rey, Calif. 90292, Feb. 8, 1994, pp. 1–20.

Athas, W. C., et al., "An Energy-Efficient SMOS Line Driver Using Adiabatic Switching," University of Southern California, Information Sciences Institute, Marina del Rey, Calif. 90292, Jul. 30, 1993, pp. 1–16.

Younis, Saed, et al., "Asymptotocally Zero Power Split-Level Charge Recovery Logic,"]MIT Artificial Intelligence Laboratory, Cambridge, Mass. 02139, unpublished, 4 pgs.

Younis, Saed, et al., "Practical Implementation of Charge Recovering Asymptotically Zero Power CMOS," 1993 Symposium on Integrated Systems, MIT Press, 1993, pp. 234–250.

Hall, J. Storrs, "An Electroide Switching Model for Reversible Computer Architectures," Proceedings of the Workshop on Physics of Computation, Oct. 1992, Published by IEEE Press, 1993, pp. 1–15.

Koller, Jeffrey G., "Adiabatic Switching, Low Energy Computing, and the Physics of Storing and Erasing Information," Proceedings of the Workshop on Physics of Computation, Oct. 1992, IEEE Press pp. 1–7.

Denker, John S. et al., "Adiabatic Computing with the 2N-2N2D Logic Family," IWLPD '94 Workshop Proceedings, International Workshop on Low Power Design, Apr. 1994, pp. 183–187.

RECOVERED ENERGY LOGIC CIRCUITS

This application is a continuation-in-part of application Ser. No. 07/916,343, now abandoned, filed Jul. 17, 1992, which is incorporated herein by reference in its entirely.

BACKGROUND OF THE INVENTION

Two major trends in data processing machines have been toward greater computational power and smaller physical size. The first trend is driven by the increasing amount and types of data which are handled by computers and computer networks. Faster computers are continually sought in order to solve complex numerical problems and to process an ever increasing data load. The second trend is driven in part by the desire to have portable devices—laptop, notebook, and even handheld computers.

Some of the limitations facing computer designers as they address these two goals are related to circuit power dissipation. High speed, high integration density chips dissipate considerable power, more than can be removed through conventional packaging technology. In addition, a typical office computer is becoming limited in its computational capability by the total power available from the standard office outlet. The operating time of portable machines is limited by the amount of energy which may be stored in the batteries. These batteries are often the heaviest component of the device, yet can only provide several hours of active use.

Solutions to the above problems have been to either improve the heat removal system for the integrated circuits or to reduce the dissipation. In order to keep high performance integrated circuits operating at a reasonable temperature, workers have developed advanced packaging concepts with active or passive cooling mechanisms. Active cooling can be attractive for mainframe and supercomputer applications where cost and size are secondary considerations. Cost is more of a concern in midrange office computers however, as are fan noise and the load on air conditioning system. There is a trend to lower the power supply voltage as the line widths in integrated circuits get smaller, and this will help to reduce the overall power dissipation. In addition, portable computers have recently incorporated innovative designs which turn off inactive portions of the machine, such as disk drives, in order to save energy.

Contemporary logic circuits can be divided into two classes, those which dissipate power continuously and those which only dissipate during logic state transitions. Emitter Coupled Logic is an example of the first class; each logic stage draws a DC current that is always flowing through one or another switching transistor. Another logic style which dissipates static power is ratioed nMOS. Current flows continuously through the output transistor and load when a gate is in the false state. Complementary MOS (CMOS) and precharged MOS logic styles are examples of the second class of logic circuits. They do not require power input between changes of state; energy is only dissipated when changing a logical cell's output voltage.

SUMMARY OF THE INVENTION

A new logic style that we call Recovered Energy Logic (REL) has been developed. It features low theoretical power dissipation and efficient use of transistors to produce a two phase clocked logic structure. It is powered by an alternating voltage waveform which also serves as the clocking signal. The charging and discharging of the parasitic capacitance of a logic node is synchronized to the power supply voltage and can ideally be lossless. Using a resonant power supply, the energy required to charge the capacitance can be recovered during the discharge of the capacitance. Recovered Energy Logic can be used in place of, or alongside, other logic families to reduce the power dissipation of computing circuitry.

In accordance with principles of the present invention, a logic circuit comprises an alternating voltage power supply which supplies a common alternating voltage to a plurality of successive logic stages. The logic stages switch states in synchronization with the supply such that changing voltage levels within the logic stages closely follow changes in voltage of the supply to reduce energy losses due to voltage changes across capacitances in the logic circuit, preferably both capacitive charging and capacitive discharging energy losses. In order for the voltage levels within the logic stages to closely follow the power supply, the rise time of the alternating voltage of the power supply should be greater than or about equal to the RC time constant of each logic stage.

In accordance with other principles of the invention, successive logic stages provide the feature of a multiphase clocked system by being alternately driven by the power supply to take logical processing action based on their respective inputs. Specifically, the logic stages may comprise switchable semiconductor devices of opposite conductivity types such that logic stages of opposite types are active during respective half cycles of rising and falling voltages of the power supply. To permit each logic stage to be active in successive cycles of the power supply, nodes in each logic stage may be precharged during half cycles of the power supply in which the stage is not active in logical processing. The output of each logic stage may be precharged (previously charged or discharged) by an input device of each next stage.

A preferred basic logic element comprises an input transistor coupled to conduct between a first precharged (parasitic or explicit) capacitor and the power supply. A second transistor is coupled to conduct between a second precharged capacitor and the power supply. The second transistor is inhibited by a change in charge on the first capacitor with conduction through the input transistor. The capacitors are precharged when the stage is not active in logical processing. In a two-transistor logic element the second precharged capacitor is an output capacitor, and it may be precharged by a succeeding stage. A third transistor may be coupled to conduct between a third precharged capacitor and the power supply. This third transistor is inhibited by a change in charge in the second precharged capacitor with conductance through the second transistor. Similarly, additional transistors may be included in the basic logic element.

To build the basic logic element into a circuit more complex than a buffer or inverter, a second input transistor may be coupled to conduct between the first precharged capacitor and the power supply. With that connection, conduction of either input transistor will inhibit conduction through the next transistor in the stage. If the next transistor is an output transistor, such a circuit performs a logical NOR function. A logical NAND function can be performed by coupling plural basic logic elements in parallel to drive a common output.

A register stage may comprise successive logic stages. The first logic stage comprises first and second selector circuits. The first selector circuit selects an external input to the register stage and the second selector circuit selects an output from the second logic stage as an input to the first logic stage. Each selector circuit is comprised of the basic logic element having first and second input transistors coupled in parallel to conduct between a first precharged capacitor and the power supply. The register may further comprise a READ selector circuit to provide a readable memory. Alternatively, the register stage may be coupled in series with a plurality of like register stages to form a shift register.

To most efficiently recover and return energy to the chip with each cycle of the power supply, an inductor should be coupled across the alternating voltage power supply in parallel with the successive logic stages such that the inductor and logic stages resonate. If the alternating voltage has a DC component, means (such as a blocking capacitor) should be provided to avoid placing this DC voltage across the inductor. Because the logic stages and their resonant inductor appear as a high impedance at the fundamental frequency of the alternating voltage power supply, the only current required from the power supply is that required due to losses and due to the nonlinear nature of the load. The inductor should be closely coupled to the logic stages, preferably with leads to the chip less than 10 cm. long and having no more inductance than 5 nH, which is about the value of a standard connector. This value depends on clock frequency and chip size. At very high frequencies, 0.1 nH or even less may be preferred. The inductor and successive logic stages may even by formed on a common semiconductor chip.

A preferred power supply comprises a switching circuit which switches a DC input across a stepdown transformer. The alternating voltage of the power supply is a continuous waveform. A linear amplifier circuit may also be used to create the alternating voltage, but with less efficiency.

To minimize phase delays of the power supply between various logic chips, the logic stages may be formed on a plurality of chips which are clustered closely around a common power supply. Such a cluster and its supply might form a multi-chip module.

The power supply may be of plural phases such as three phases. Different logic circuits are then driven by different phases of the power supply. Outputs from logic stages may be applied to other logic stages of the same phase or the logic stages of other phases.

BRIEF DESCRIPTION OF THE DRAWINGS

The foregoing and other objects, features and advantages of the invention will be apparent from the following more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENT

Figure 1:
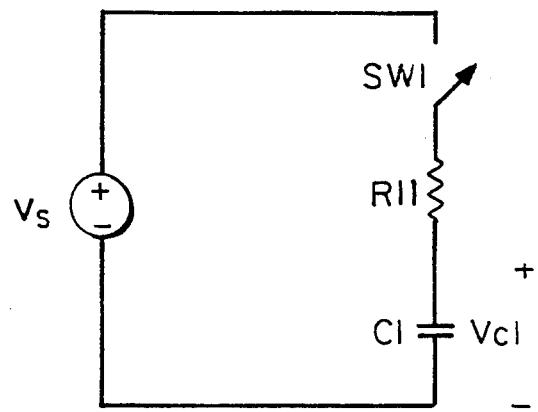
FIG. 1 is an idealized logic circuit illustrating principles of the present invention.
Figure 2:
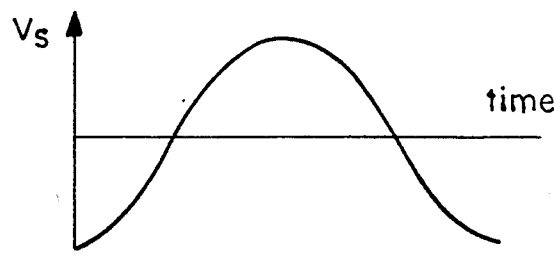
FIG. 2 is a power supply waveform used in the illustration of FIG. 1.

The basic principle behind Recovered Energy Logic is the nearly lossless charging and discharging of a logic stage's capacitance, as illustrated in FIGS. 1 and 2. A transistor is simply modelled as an ideal switch SW1 and some resistance R11, while the capacitor C1 is the parasitic capacitance in the circuit which stores the logical output state. If the capacitor voltage is at a low value corresponding to a logic zero, and it is desired to charge the capacitor to a high voltage corresponding to a logic 1, then the switch is closed when $v_s$ is at its lowest value (FIG. 2). If the voltage source frequency is much less than the characteristic frequency of the RC network, $\frac{1}{2\pi RC}$, then the output voltage is always essentially the same as the voltage source. In this limit the voltage drop across the resistor is very small, and thus the power dissipated in it is also small. When the voltage source reaches its peak, the switch is then opened to store the high logic state. When the capacitor must be discharged to a low state, a similar process is followed. The switch is closed when the voltage $v_s$ reaches its peak and remains closed while the capacitor is nearly losslessly discharged back to the source.

Figure 3:
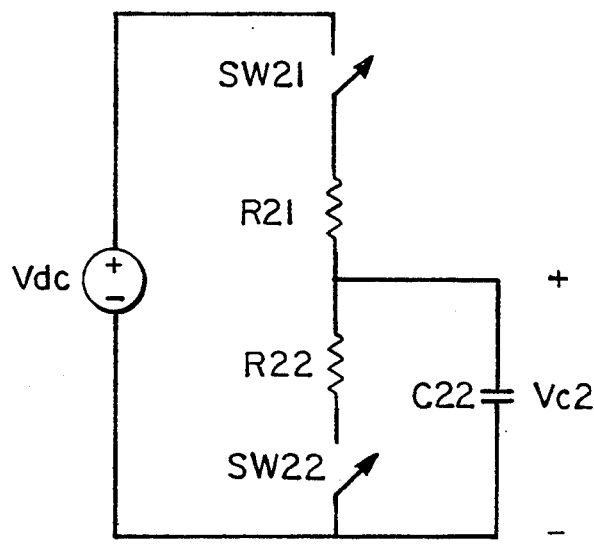
FIG. 3 is a model of a CMOS logic circuit.

This is in direct contrast to the CMOS style of capacitor charging (FIG. 3) where the voltage across the resistor R21, and thus also the current through it, is high when SW21 is closed due to the constant high voltage source Vdc. Independent of the resistor value $R_{21}$, the energy dissipated in it during charging is $\frac{1}{2}CV_{dc}^2$, or equal to the amount stored on the capacitor C2. To discharge the capacitor, a CMOS circuit closes the second switch (SW22) and dissipates the stored capacitor energy in the second resistor R22.

Recovered Energy Logic accomplishes its low dissipation by reducing the difference between the source voltage and the capacitor voltage while the capacitor is being charged or discharged. In addition, the voltage source has the ability to store the energy returned from the capacitor when it is discharged so that not only is there ideally no dissipation in the logic circuit, but the recovered energy may be used later. To do this, REL uses a power supply that can be modeled as an alternating voltage source and it includes an inductive component to store and return most of the recovered energy. The design of this supply will be considered later.

Simple Logic Elements

Figure 4A:
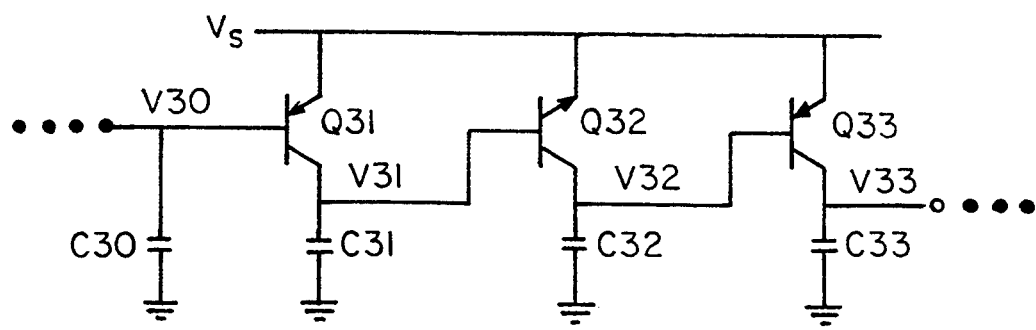
FIG. 4A illustrates a chain of single transistor logic elements embodying the present invention.
Figure 4B:
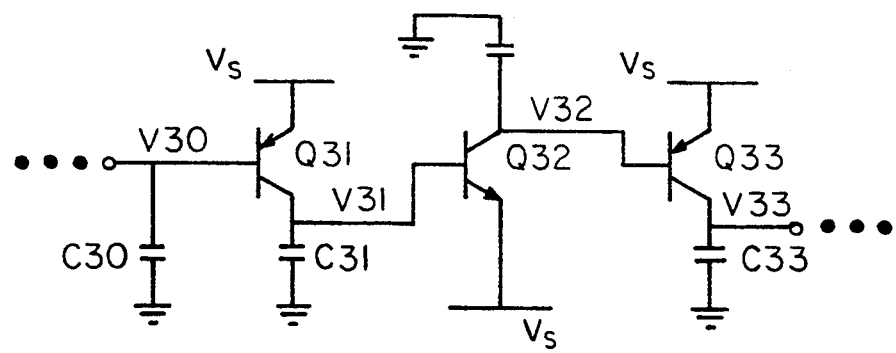
FIG. 4B is the circuit of FIG. 4 redrawn for ease of understanding.

The topology of Recovered Energy Logic implemented in bipolar junction transistor technology is shown in FIG. 4A. The simplest stage of an REL circuit comprises a single transistor, and FIG. 4 shows three consecutive stages composed of transistors Q31, Q32 and Q33. FIG. 4B shows the same circuit redrawn in a way which might be easier to understand. It is important to remember that all of the emitters are connected to the same potential, the power supply. Notice also that the stages alternate in type of transistor: first composed of npn, then of pnp transistors. This feature is important to the operation of REL where the stages are activated, that is clocked, by the power supply itself.

Figure 5A:
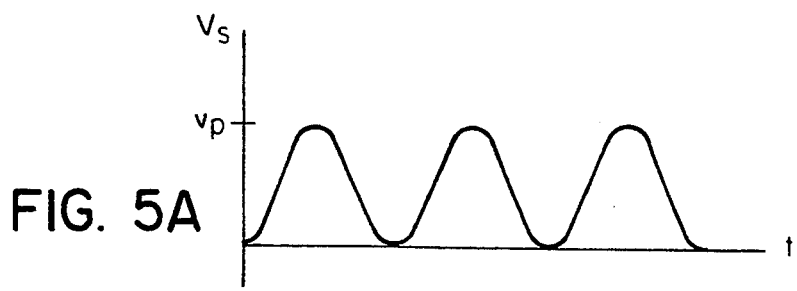
FIGS. 5A–5E illustrate possible power supply waveforms.
Figure 5B:
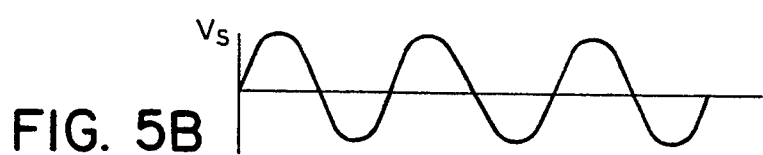
Figure 5C:
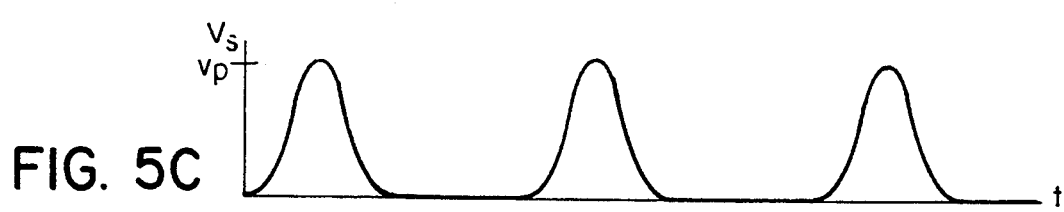
Figure 5D:
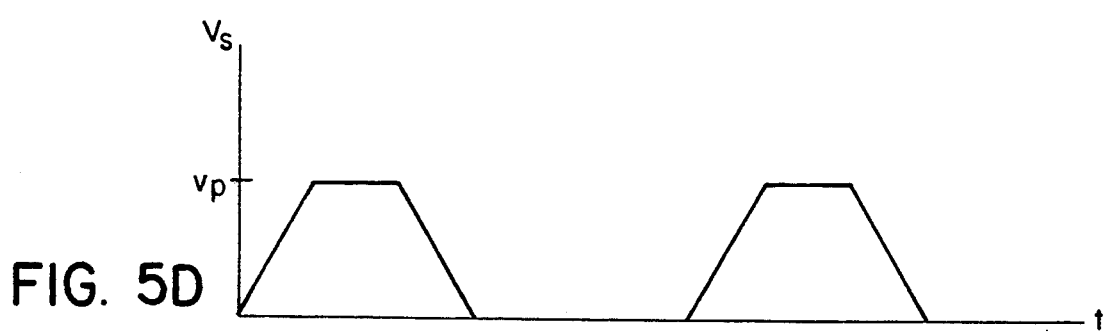
Figure 5E:
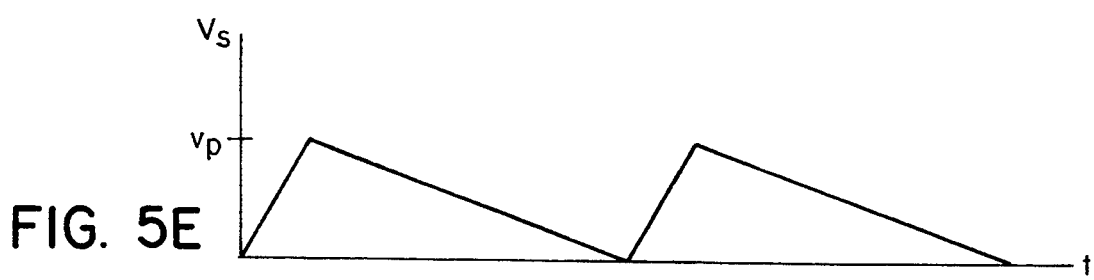

The alternating supply voltage may have a dc component but has a shape that is sinusoidal, trapezoidal, or the like. In these descriptions we will assume the alternating voltage is a sinusoidal waveform with a DC component so that the lowest voltage from the supply is zero volts and the highest is a value we will call $v_p$ as shown in FIG. 5A. However, no DC component is required and a power supply voltage as indicated in FIG. 5B may be used. Further, the power supply waveform need not be continuous; as illustrated in FIG. 5C, there may be delays between pulses. Also, the waveform need not be of sinusoidal shape. FIG. 5D illustrates a trapezoidal shape where there are delays after both rise and fall times, and FIG. 5E illustrates a triangular waveform. Note in FIG. 5E that the rise and fall times are of different durations. The rise and fall times of the supply should be no faster than approximately the RC time constant of a logic stage so that charging voltages on the charging and discharging capacitors C30–C33 closely follow the power supply.

Assume for ease of explanation that the base-emitter on-state voltages and the collector-emitter saturation voltages for the transistors are small compared to $v_p$. Assume further that the circuit starts with $v_s$ at its lowest level (zero) and that all the odd numbered nodes V31, V33 are also near zero. As $v_s$ rises to its peak, Vp, the npn transistors such as Q32 will be in the off-state because their base emitter junctions are reverse biased. If an even numbered node V30, V32 is initially high (near Vp), then the pnp transistor connected to it will remain off because its base-emitter junction will also be reverse biased. The odd node at its output (collector) will therefore remain at a low voltage because both the npn and the pnp transistor connected to it will be off during this half cycle. On the other hand, if the even numbered node is initially low, then the pnp transistor to its right will turn on when $v_s$ rises one diode drop above this node voltage. The collector current of this transistor will then charge its output capacitor up to a collector-emitter saturation voltage drop below Vp, and its base current will charge its input capacitor up to within one diode drop of Vp. Thus, we can see at the end of the rising half cycle of $v_s$, the voltages of the odd nodes depend upon the voltages of the even nodes at the start of this half-cycle. Furthermore, the even nodes always end in the high state, regardless of their state at the beginning of this rising part of the supply voltage waveform.

During the falling transition of the supply voltage, the circuit operation is the same except that the npn transistors including Q32 are active. Note that the even numbered nodes are all high at the start of this transition, and that as $v_s$ falls, the base-emitter junctions of the pnp transistors will be reverse biased, keeping them in the off-state. During this half cycle, if the odd input nodes are low, the npn transistor will remain off, and so the even output nodes will remain high. If the input to an npn had been brought high during the previous half cycle, then that transistor will turn on, discharging both its input and output capacitors. The voltage at the even output nodes at the end of the falling half cycle depends on the odd input nodes at the beginning. We are now ready for another pnp half cycle, and the odd input nodes have all been set low, as we assumed above.

Three functions are performed by the above topology. First, the logical values of the inputs are evaluated and used to control the outputs. The circuit in FIG. 4 only passes the state along, more complex circuits perform logical functions on the inputs. Secondly, the output of each stage is precharged by the base current of the transistor in the next stage to a known value so that the first stage may operate correctly in the succeeding clock phase. Finally, the chain of logic stages is clocked in a two phase non-overlapping manner by the alternating supply voltage and the alternating types of transistors. This synchronizes the various logical signals present in the circuit.

Figure 6:
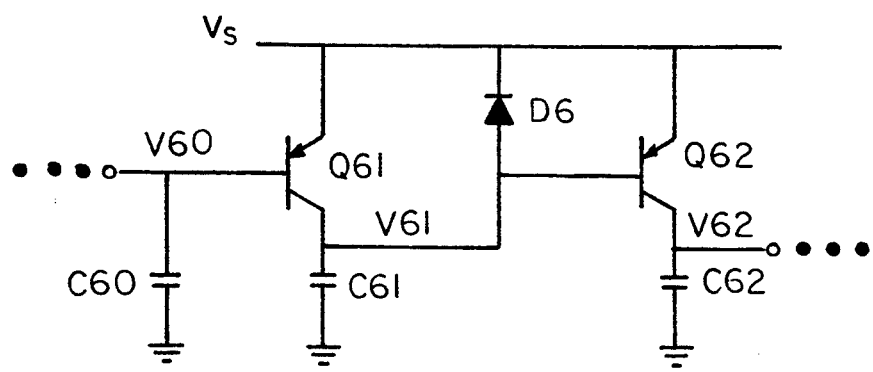
FIG. 6 illustrates a two-transistor logic element embodying the present invention.

Let us now expand these concepts to stages which might have several transistors of the same type. The operation of multiple transistor stages is slightly different than that of single transistor stages. A stage composed of two pnp transistors is illustrated in FIG. 6. Like all pnp-type stages, it is active on the rising transition of the supply voltage. Assume that initially V61 and V62 are zero or $-V_p$ (or low). If the input V60 to the stage is low, then Q61 will turn on as the supply voltage rises. This quickly charges V61 of Q62 up to a saturation voltage drop below $v_s$, so that the base-emitter junction of Q62 will never become sufficiently forward biased. Transistor Q62 will remain off and the output, V62, will be left low. If the input, V60, is high, however, then transistor Q61 will remain off, and Q62 will turn on, charging up both V61 and the output V62. At the end of this rising cycle, the output will be low if the input was low, and will be high if the input was high. This is the opposite of what we found for the single transistor stage. During the falling part of the supply waveform, the diode D6 will reset V61 to a low value much in the same way as the npn stage connected to the output does for V62. As discussed below, logic stages of chains of three and four transistors operate in a similar fashion; the final transistor in the chain is either allowed to conduct or is cut off based on whether the previous transistor is turned on or remains off.

Figure 7A:
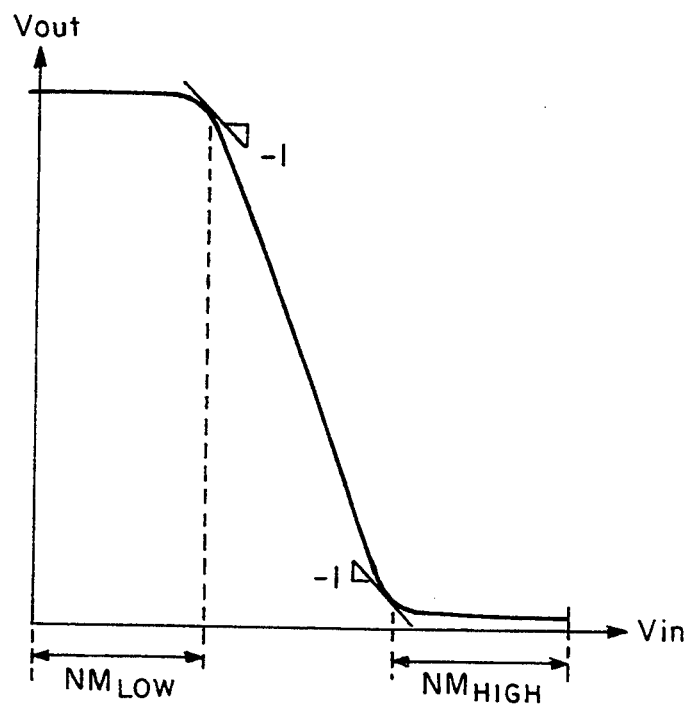
FIG. 7A is a generalized transfer function.
Figure 7B:
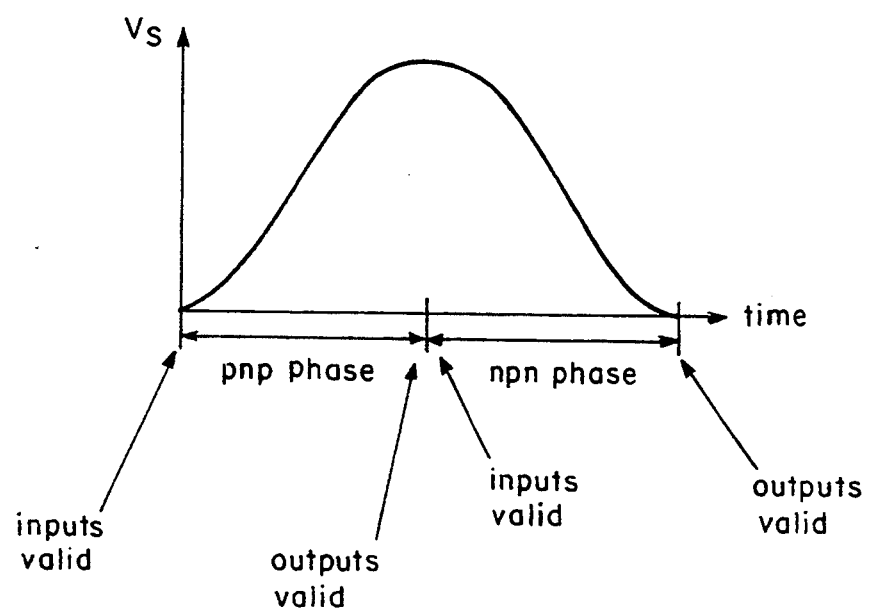
FIG. 7B illustrates the timing of signals $V_{out,valid}$ and $V_{in,valid}$ relative to the power supply waveform.

The transfer function of a REL stage is a plot of the output of that stage at the end of its active period as a function of the input voltage at the beginning of its active period. These plots are similar to input-output plots of other logic styles. The noise margins (NM) of the circuit will be defined as the range of input voltages which produce valid output voltages. The end of the noise margin is defined to be the location where the slope of the transfer function has magnitude 1, as shown in FIG. 7 for a generic transfer function. Note that the inputs and outputs are measured only during the times in which they are valid. For pnp stages, this means that the input voltage is measured when the power supply is at its most negative value and the output voltage is measured when the power supply is at its most positive value. The opposite is true for npn stages. These relationships are summarized in FIG. 7B.

Graphs of the transfer functions of one and two transistor stages of bipolar transistors are shown in FIGS. 8 and 9.

Figure 8A:
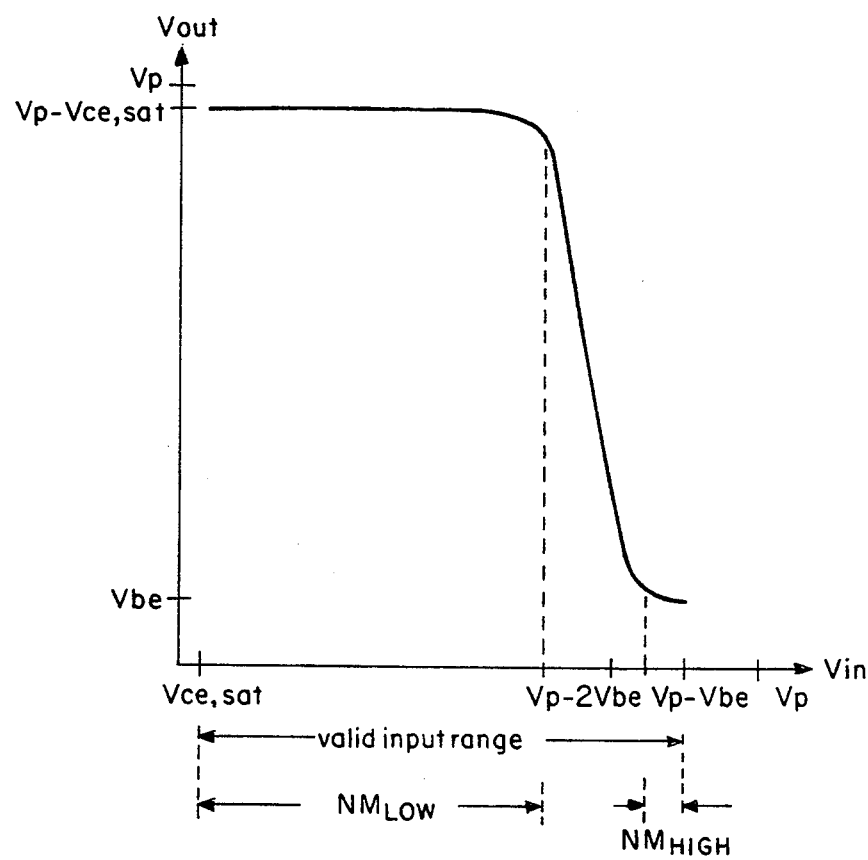
FIG. 8A is a transfer function of a single pnp transistor logic element.
Figure 8B:
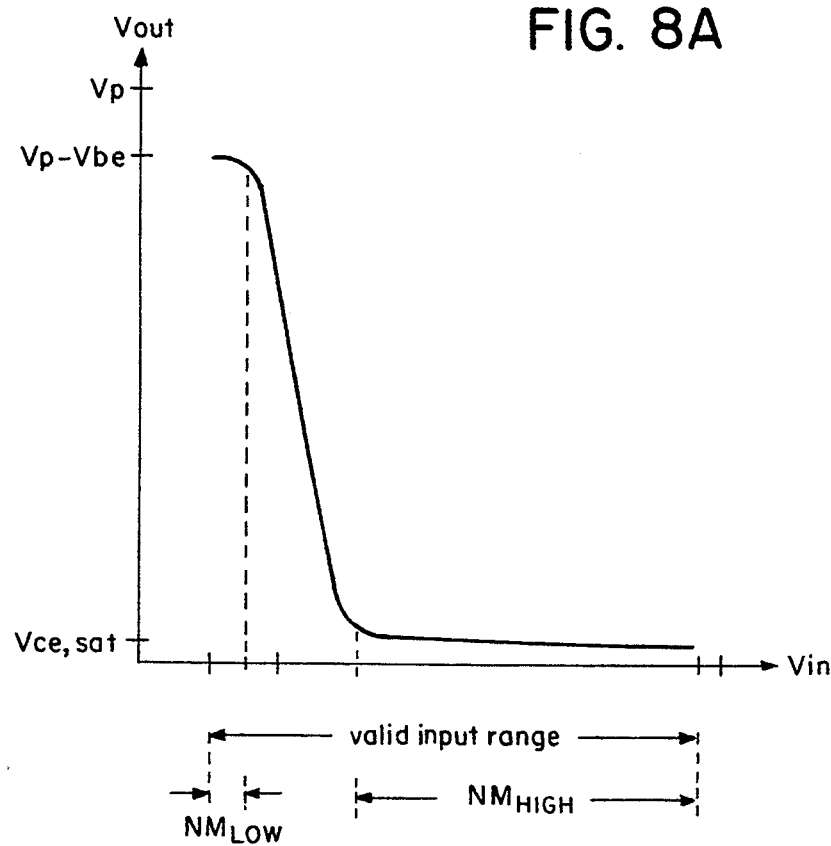
FIG. 8B is the transfer function of a single npn transistor logic element.
Figure 9A:
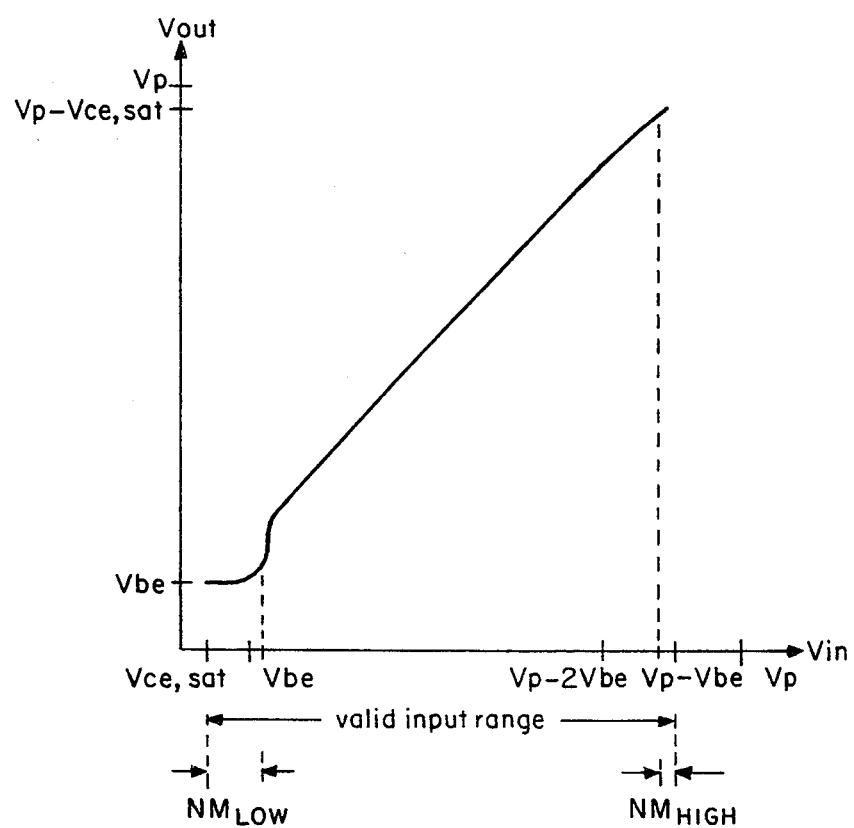
FIG. 9A is the transfer function of a two-transistor pnp logic element.
Figure 9B:
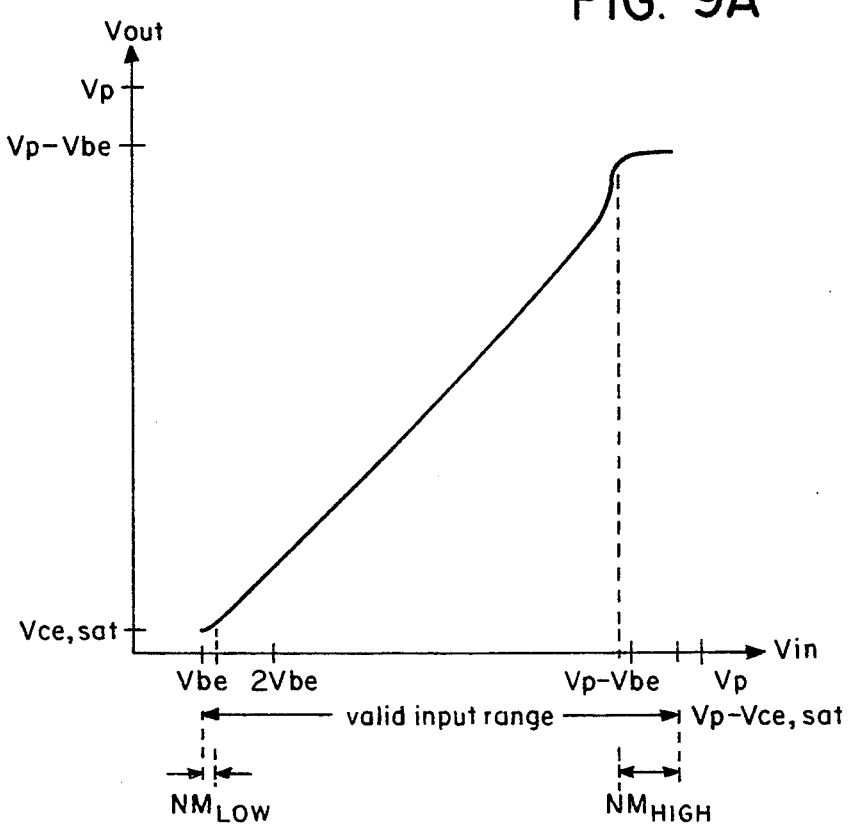
FIG. 9B is a transfer function of a two-transistor npn logic element.

The pnp and npn versions are similar to each other as the two types of stages operate in a similar manner. In fact, if one makes the substitution $V'=V_p-V$ on both the x and y axes, the resultant plot will coincide with the plot of the opposite type. FIGS. 8A and 8B are the transfer function of single transistor pnp and npn stages respectively, and FIGS. 9A and 9B are the transfer functions of two-transistor pnp and npn stages respectively.

An important point to note is that the valid voltage levels vary according to location in the circuit. The highest possible high out of a pnp stage is $V_p-V_{ce,sat}$, while the minimum valid output is Vbe of the following npn transistor. Just the opposite is the case for npn stages: the output can be discharged to Vce,sat above zero, but it cannot be greater than $V_p-V_{be}$. Because the output of one gate is the input to the next, the input range is also less than the full power supply swing. These valid input ranges are marked on the abcissas of the plots in FIGS. 8 and 9.

The impact of this restricted input range is that the transfer functions of one-transistor stages are not restoring for the high input condition to a pnp stage (low for npn stages). An input slightly below the highest possible value will result in an output which is above the minimum output. This error will be exacerbated if the next stage also consists of one transistor, as the input to an npn above the minimum will lead to an output even further away from a high value. This problem stems from using the same base-emitter diode to precharge the input and to later test its level.

Consider a logic stage composed of a single pnp transistor (FIGS. 4 and 8B). It begins its active period with the power supply voltage and the output voltage both low (0 volts for the supply, 0.6 volts for the output assuming a diode drop of 0.6 volts). As the power supply voltage increases, the transistor remains off until that emitter voltage is about 0.6 volts above the input voltage. If the input voltage is low enough, the transistor will turn on, charging both the input and output capacitors. An input within 0.6 volts of the maximum power supply voltage will keep the transistor off and the output voltage will be low at the end of the cycle. However, if the input is slightly below this level, then the transistor will turn on briefly at the end of the active period. This will charge up the output capacitor to some extent; the higher the gain of the transistor, the more the charging.

Note however, that the highest possible input voltage is 0.6 volts lower than the peak. That is because it is precharged by the same base-emitter diode on a previous cycle. Thus the valid range of inputs to a pnp stage in an operating REL circuit is 0 volts to 0.6 volts less than the peak supply. If the input voltage is much below $V_p-0.6$, the output will be high. For this reason, a single transistor stage has a very small noise margin for the high inputs. The result is the same for an npn stage but the small noise margin is on the low input side.

The case of two-transistor REL stages is slightly different (FIGS. 6 and 9) and can offer improved noise margins. In order to obtain a low output value, the first transistor Q61 in FIG. 6 must turn on before the second transistor Q62. Assume that the intermediate node V61 begins at 0.6 volts. In order for Q61 to turn on first, its input voltage must be lower than 0.6 volts. If the input is in the range 0 to 0.6, then the second transistor will always be cut off and the output will be low. If, on the other hand, the input is above 0.6 volts, then the second transistor Q62 will turn on first. It will remain on until the supply voltage rises 0.6 volts above the input, turning the first transistor on, cutting off Q62, and leaving the output at the value of the supply voltage at that instant. Thus we see that the output voltage will be 0.6 volts (low) for the input range 0 to 0.6, and $V_{in}+0.6$ for inputs greater than 0.6 volts.

This small flat portion of the curve shown in FIG. 9A is the low input noise margin of the circuit. There is no explicit high side noise margin, because the maximum input voltage is the peak voltage minus 0.6 volts. Notice however, that the transfer function of a similar stage composed of npn transistors has a flat portion on the high input side. As long as the input to an npn two transistor stage is within 0.6 volts of the maximum, the output will be restored to $V_p-0.6$. In addition, if the maximum supply voltage of the circuit is lowered, these non-linearities become a much larger fraction of the total. The noise margins increase in comparison to the signal swings as the peak voltage is reduced.

In real transistors, the junction voltage drops are not always 0.6 volts and the saturation voltages are often greater than zero. In addition, the presence of parasitic capacitances prevents the transistors from turning on or off instantly. This affects the transfer functions slightly, but the above explanation covers the essential issue of noise margin in Recovered Energy Logic.

Figure 10:
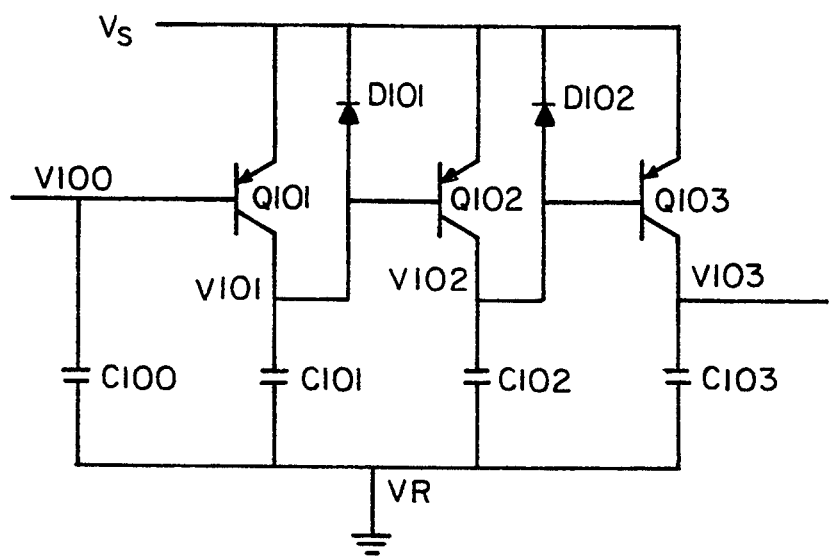
FIG. 10 is a circuit diagram of a three-pnp transistor logic element.

The three transistor logic structure has a transfer function similar to that of the one transistor cell; however, it can offer improved noise margin performance. A three transistor structure implemented in pnp transistors Q101, Q102 and Q103 is shown in FIG. 10. Capacitors C100, C101, C102 and C105 serve to store voltages at nodes V100, V101, C102 and V103, respectively, while node VR is the ground, or reference, node. As with all p-type stages, it begins its active period with a low voltage on the power supply node $v_s$. Nodes V101 and V102 have been previously discharged to a low voltage (about 0.6 volts) by diodes D101 and D102, while node V103 has similarly been discharged by the npn transistor of the next logic stage. The power supply voltage $v_s$ is rising toward its positive peak.

If the input node V100 is a high voltage (for example, within 0.6 volts of the peak supply voltage), then transistor Q101 will remain off. Transistor Q102 will turn on because its emitter-base junction becomes forward biased when the supply voltage rises 0.6 volts above the voltage at V101. Because transistor Q102 is on, the voltage on node V102 is very close to that of the supply voltage. The emitter-base junction of transistor Q103 is thus not significantly forward biased, and it remains off, leaving the output at node V103 low. The range of input voltage V100 over which this occurs is from the peak supply voltage to about 1.2 volts below the peak (two times the forward drop of a p-n junction). Within this range, the voltage at node V102 will never be more than 0.6 volts below the supply voltage, and transistor Q103 will remain off.

On the other hand, if the input node V100 is low (for example 0 volts), then as the power supply voltage rises, transistor Q101 will become forward biased before transistor Q102 does due to the npn stage output voltage of less than 0.6 volts (collector emitter saturation voltage). Transistor Q101 keeps the voltage difference between nodes $v_s$ and V101 very small, transistor Q102 remains off, leaving node V102 unaffected. Because node V102 started out low, transistor Q103 will become forward biased and will turn on, charging the output node V103 to a high voltage.

Figure 11A:
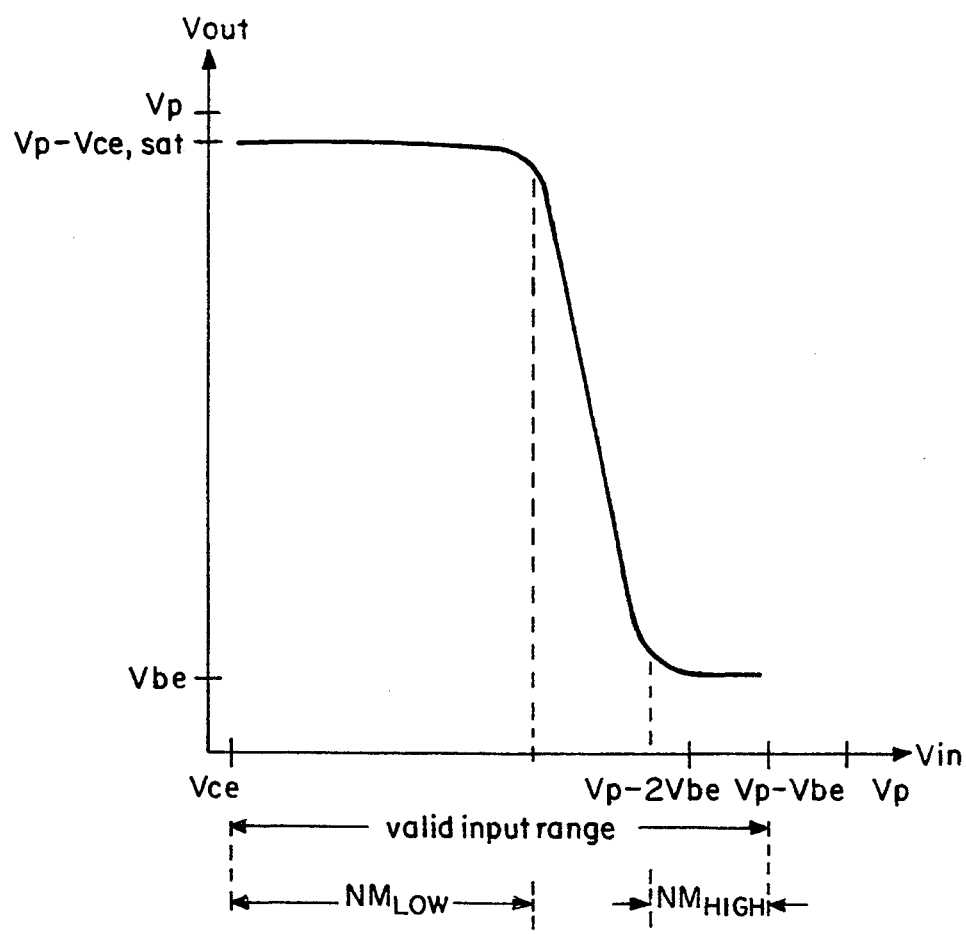
FIG. 11A is a transfer function of a three-pnp transistor logic element.
Figure 11B:
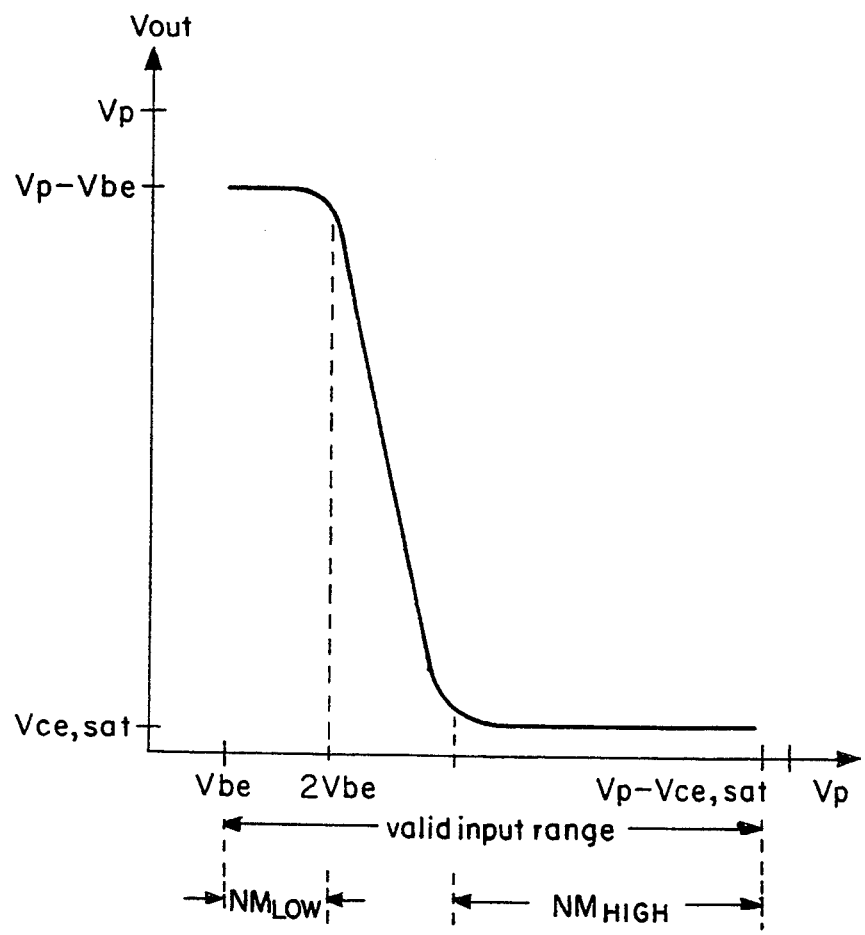
FIG. 11B is a transfer function of a three-npn transistor logic element.

When the input voltage is between the high and low input ranges, the exact supply voltage and timing affect the final output. A representative transfer function for this three transistor pnp circuit is shown in FIG. 11A and that of a three transistor npn circuit is shown in FIG. 11B.

Figure 12:
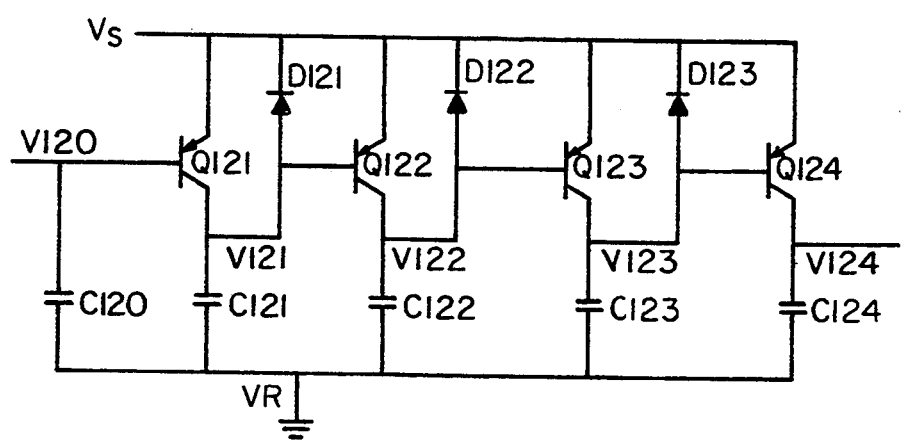
FIG. 12 is a circuit diagram of a four-transistor logic element.

The operation of the four transistor structure of FIG. 12 is similar to that just described; however, the transfer function is more like that of a two transistor stage. These structures can offer improved noise margin for a high input voltage in a pnp type stage. The delays through the stage are such that the noise margin for low inputs may suffer, however. Like the previous description, the capacitors C120, C121, C122, C123 and C124 store the circuit voltages and node VR is the reference voltage. Diodes D121, D122 and D123 and the npn transistor of the succeeding stage precharge nodes V121, V122, V123 and V124 to a low voltage. The power supply voltage $v_s$ starts at a low voltage and rises.

If the input V120 is a high voltage, transistor Q121 remains off, as before. Transistor Q122 turns on and prevents transistor Q123 from conducting. As node V123 is low, transistor Q124 will become forward biased and pull the output V124 to a high voltage. The range of input voltages over which the output is high is at least as large as for a three transistor structure. If the input voltage is low enough, transistor Q121 will conduct briefly, turning transistor Q122 off. This can allow transistor Q123 to turn on, shutting transistor Q124 off before the end of the active period. This leaves the output between high and low.

Figure 13A:
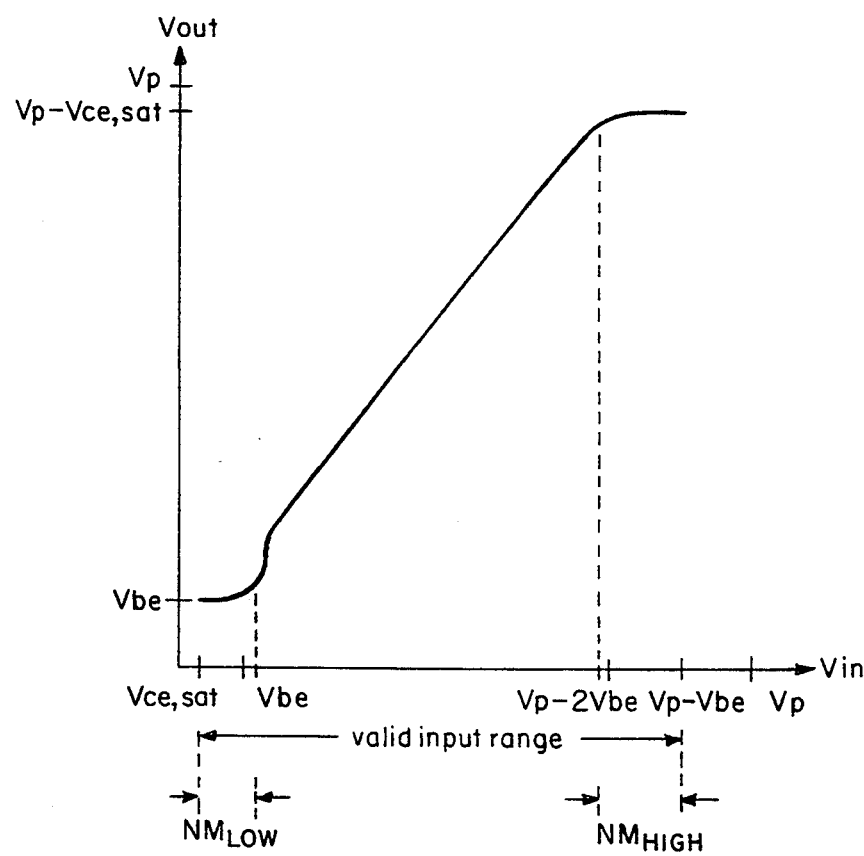
FIG. 13A is a transfer function of a four-pnp transistor logic element.
Figure 13B:
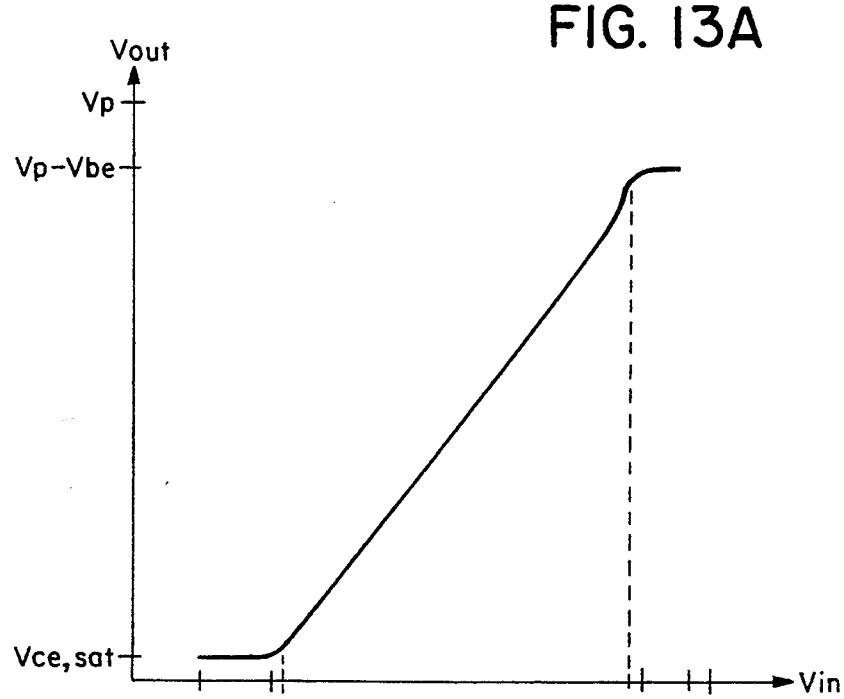
FIG. 13B is a transfer function of a four-npn transistor logic element.

When the input voltage is low, transistor Q121 turns on, keeping transistor Q122 off. This allows transistor Q123 to turn on, preventing transistor Q124 from turning on. Thus the output V124 should be a low voltage. A potential problem occurs when the node voltages V121, V122 and V123 are all precharged to the same low voltage. As the power supply voltage rises, transistors Q122, Q123 and Q124 will all start to turn on at the same time. In order to prevent transistor Q124 from conducting, the input must be low enough to turn transistor Q121 on before transistor Q124. Because there are delays inherent in a chain of transistors, this means that the input voltage must be less than the precharge voltage on nodes V121, V122 and V123 (which in this example would be 0.6 volts). While the two transistor stage has a low input noise margin of about 0.6 volts, the fourth transistor stage has a smaller noise margin. Sample transfer functions are shown in FIGS. 13A and 13B.

Logic Levels

There are two different ways to assign logical values to the voltage levels present in REL. Each provides a different view of the operation of the circuit. The first and more easily understood method is similar to normal positive logic, and will be designated High/Low. A logical "1" is assigned to a high voltage and a logical "0" is assigned to a low voltage. Thus one and three transistor stages are inverters because at the end of the active half-cycle of the power supply they have a high output voltage when their input is low, and vice versa. Likewise, two and four transistor stages are buffers. The difficulty with this High/Low view is that when more complex logic stages are created, n-type and p-type stages of the same topological structure exhibit different logical functions.

The second way to assign logic values addresses this dichotomy between the topological structure and function of complex stages. A logical "0" is assigned to the input of a stage if that input causes the input transistor to remain off during its active half-cycle of the power supply. Thus a high voltage at the input of a pnp stage and a low voltage at the input of an npn stage are both logical "0." In a similar manner, a logical "1" is given to an input which would turn the input transistor on in the active half cycle. The output of a stage is given the logical value of the input to the next stage. This scheme is easiest to think about in terms of whether the input transistor will turn on (or is active), thus it will be called Activity Logic.

Using the Activity Logic method, one and three transistor stages become buffers. For example, a high pnp input (logical "0") produces a low output, which keeps the following npn transistor off the next half cycle. Thus the output is also a logical "0." Similarly, two and four transistor gates are inverters.

Multiple Input Logic Circuits

The utility of the Activity Logic definition is evident when considering multiple input logic circuits. The simplest of these are the NOR and the NAND, which are created by adding parallel transistors to the basic two-transistor structure. This idea can be generalized to create more complex logic functions.

Figure 14:
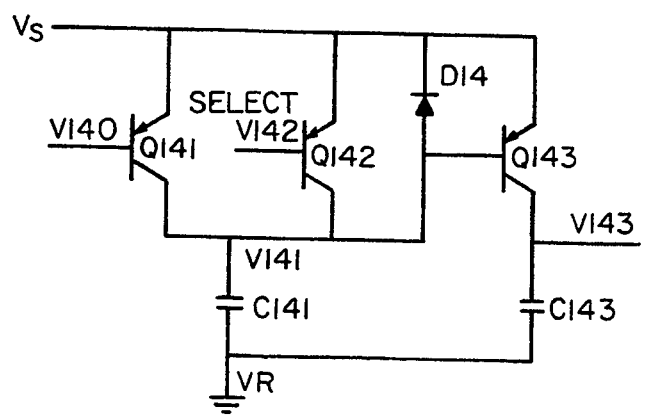
FIG. 14 is a schematic circuit diagram of a simple two-pnp transistor selector NOR circuit.

A NOR gate is shown implemented in pnp transistors in FIG. 14. As in all REL circuits, node $v_s$ is the power supply, node VR is the reference, capacitors C141 and C143 represent capacitances in the structure and store the voltages used for logical operations, and diode D14 precharges node V141 low when the power supply is a low voltage.

The operation is as follows. If either of the inputs V140 or V142 is low at the start of the pnp phase, the corresponding transistor (Q141 or Q142, respectively) will conduct. This makes the voltage at node V141 almost the same as the power supply, and keeps transistor Q143 off. The output will remain at its precharged low value. However, if both V140 and V142 begin the pnp phase at a high voltage, both input transistors will remain off, and transistor Q143 will conduct, pulling the output high. If either of the inputs is Active (logical 1) the output is low, which is Inactive (logical 0) for the succeeding npn stage. Otherwise, the output is high, or Active (logical 1) for the npn stage. This is the definition of a NOR logic gate.

Figure 15A:
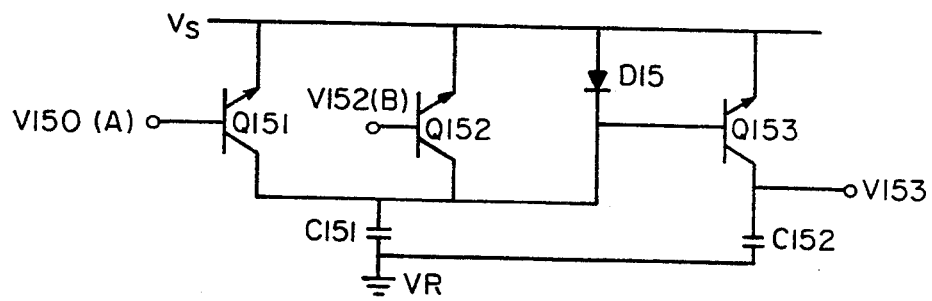
FIG. 15A is a circuit diagram of a NOR gate implemented with npn transistors.

Now consider the same topology constructed of npn devices as in FIG. 15. If either of the inputs V150 or V152 is high (or Active) at the start of the npn phase of operation, transistor Q153 will be cut off, and the output will be high (Inactive for the succeeding pnp stage). If both inputs are low, then the output will also be low (Active). Once again, this is a NOR gate. Notice that if this circuit is analyzed using the High/Low viewpoint, this is an OR gate, while the same topology using pnp transistors performs the AND function. The Activity Logic method allows one to view a REL topology as having a single logical function.

Figure 15B:
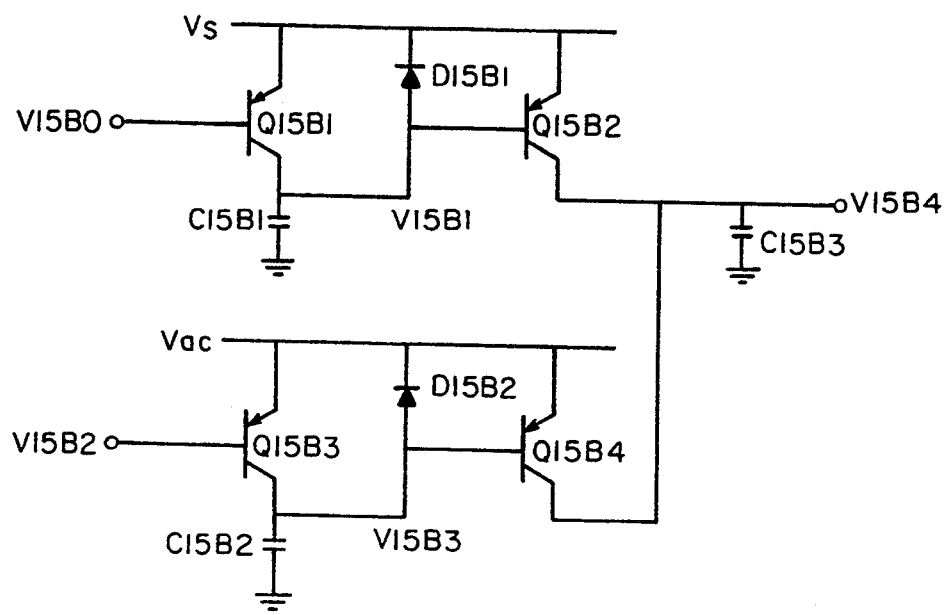
FIG. 15B is a circuit diagram of a NAND gate implemented with pnp transistors.

A NAND gate may be made by paralleling the output transistors of two two-transistor structures, as shown in FIG. 15B. In this case, the output will be its precharged low value (Inactive) unless one of transistors Q15B2 or Q15B4 conducts. If either of the inputs V15B0 and V15B2 are high (Inactive), then the corresponding input transistor (Q15B1 or Q15B3) will remain off, and the output transistor (Q15B2 or Q15B4) will conduct and bring the output high (Active). If both of the inputs are low (Active), then the output will remain low. This is the NAND logical function.

Figure 16:
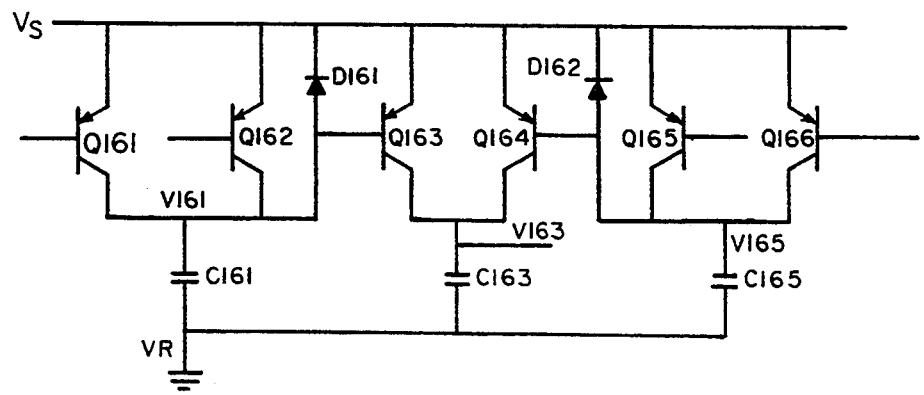
FIG. 16 is a circuit diagram of a pair of pnp selectors coupled in parallel to form a sum of products logic element.

These logical gates may be extended to multiple inputs by placing more transistors in parallel with Q141 and Q142 for the NOR gate, or with Q15B2 and Q15B4 for the NAND gate. Furthermore, the NOR and NAND structures may be combined, as shown in FIG. 16. Here V163 is the output voltage, and the inputs are A, B, C, and D. The operation is similar to that of the previously explained structures. The output V163 will be brought high during the pnp phase of the clock if one of the transistors Q163 or Q164 pull it high. In order for one of these events to occur, both the corresponding inputs (either A and B, or C and D) must be high. By enumerating all the possible inputs and the corresponding outputs, one can derive the Boolean function of this gate using the Activity Logic convention:

$$\text{Output} = (\overline{A+B}) \cdot (\overline{C+D}) = \overline{A} \cdot \overline{B} + \overline{C} \cdot \overline{D}$$

All logical functions can be reduced to the so-called sum-of-products form: $a \cdot b + c \cdot d + \ldots$, where in general, the variables, a, b, d ... represent the inputs and their complements. The circuit of FIG. 16 is important because it can perform this sum-of-products function. To create a term $A \cdot B \cdot E$, an additional transistor may be placed in parallel with Q161 and Q162. To create an additional term $F \cdot G$, a set of transistors like a NOR gate may be added with the output transistor in parallel with Q163 and Q164. Finally, the complement of an input may be created by adding a transistor, capacitor, and a diode to the corresponding input. This creates a structure like a three-transistor stage where the path from input to output is three transistors long. This third transistor inverts the input, much in the same way that a three-transistor stage has the inverse logical function of a two-transistor stage.

Programmable Logic Arrays

A programmable logic array (PLA) is a structure which has been devised to construct logic circuits in a regular and efficient manner. As mentioned above, any complex Boolean function may be reduced to a "sum-of-products" form, or the logical OR of a number of two term AND functions. The inputs to these sums of products must in general be both the inputs to the original function and their complements. The sum-of-products structure discussed above, perhaps extended, is the ideal way to implement these functions.

Figure 20:
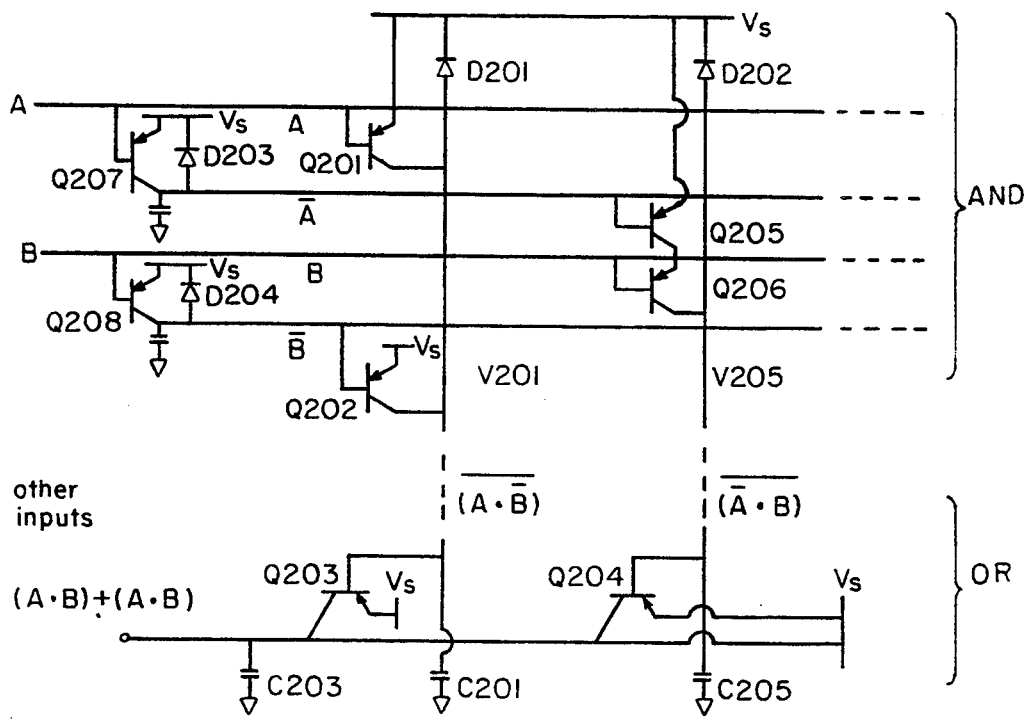
FIG. 20 is an illustration of a programmable logic array.

A PLA is a generalization of such a structure. Each PLA contains two arrays, the AND plane and the OR plane, where the logical operations take place. These are laid out on a chip as arrays of transistors and possible connections, like in FIG. 20. The inputs (A and B in the figure) enter the AND array horizontally and their complements are formed through transistors Q207 and Q208. The intermediate (AND) terms in the logical function(s) are created by connecting horizontal wires to vertical wires with transistors Q201, Q202 and Q205, Q206. The two vertical wires V201 and V205 in FIG. 20 correspond to nodes V161 and V165 in FIG. 16 and are the intermediate terms. The intermediate terms are ORed together by connecting the vertical wires to horizontal ones with transistors in the OR plane. In the figure, only one output is created by ORing the two intermediate terms. The ORing transistors Q203 and Q204 correspond to transistors Q163 and Q164 in FIG. 16. In general, there could be many more inputs, intermediate terms, and outputs. Furthermore, chip area can frequently be saved when output functions contain common intermediate terms.

Selectors

A basic building block for logical systems is a unit we will call a selector. A selector has the property that for one logical value of its "select" input the output has a known value, and for the opposite logical value of the select input, the output depends upon the other input. One example of a selector in current technology is a tri-state buffer, which operates as a buffer when selected, and an open circuit when not selected. In CMOS circuits, selectors can be conveniently constructed out of pass transistors, which are open when not selected. The logical functions AND and OR and their inverses are also selectors. For an AND gate, the output is false if either input is false, and is equal to the other input when one input is true.

A selector may be implemented in REL as a NOR gate like that of FIG. 14. Let us choose V142 as the SELECT input. During the pnp phase of the power supply, if V142 is high, transistor Q142 remains off, and the circuit operates as a simple two transistor stage. Transistor Q141 turns on if the input V140 is low, charging node V141 and keeping transistor V143 off. The output V143 is then low. If the input is high, transistor Q141 remains off, and transistor Q143 conducts, pulling the output high. Thus the output value at the end of the active time is the same (high or low) as the input.

On the other hand, if the SELECT input V142 is low, transistor Q142 will turn on, making the voltage at node V141 almost the same as the supply. Transistor Q143 will not turn on and the output will be low, regardless of the state of input node V140. Furthermore, since the output transistor remains off, this is like a tri-state device in that a number of output transistors like Q143 may be connected in parallel at node V143.

Another basic building block is the AND-OR circuit shown in FIG. 16. This circuit can also be described as two selectors, each analogous to the one in FIG. 14, connected in parallel at their outputs. In this case, transistors Q161, Q162 and Q163 form one selector, and transistors Q164, Q165 and Q166 form the other. The operation is very similar to that of the previous section. The output V163 will be brought high if one or the other of the selectors (or both) pull it high, otherwise it will be low (transistors Q163 and Q164 off, node V163 disconnected). By making one input (such as B) the complement of an input to the other selector (such as C), a circuit which chooses between the remaining inputs is created. In this case, the circuit would have its output voltage the same as either A or D, but not both.

Registers

Figure 17A:
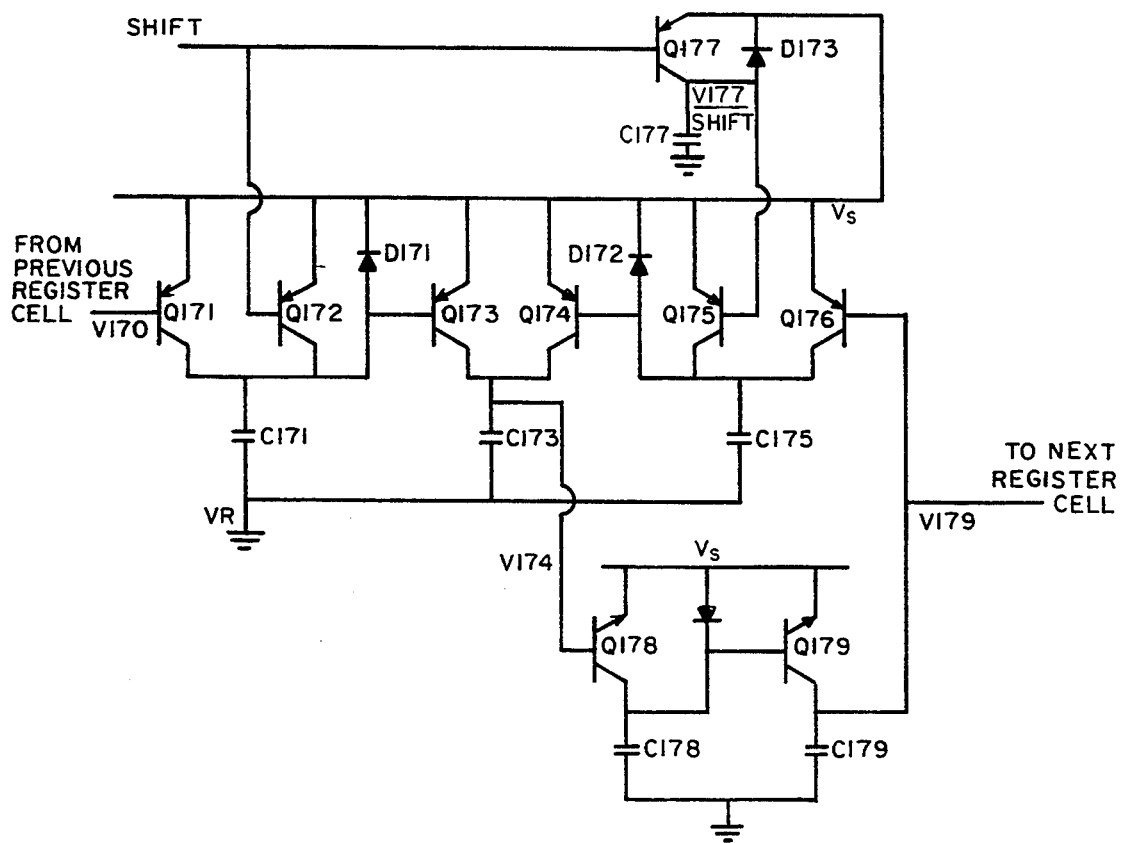
FIG. 17A is an illustration of a shift register stage comprising two logic stages.

A common use for selectors is as part of a shift register, which either stores a string of logical bits or shifts them along a line. One possible implementation of a single stage of a shift register is shown in FIG. 17A. The selector portion (transistors Q171–Q177; diodes D171, D172 and D173; and capacitors C171, C173, C175, C17 and C177) is composed of two selectors which have complementary inputs, as discussed above. The remaining transistors Q178 and Q179, diode D174, and capacitors C178 and C179 form a standard two transistor npn stage. The power supply node $v_s$ starts low (for example zero volts, the voltage of the reference VR), rises to a high voltage, and then falls back to low.

Figure 17B:
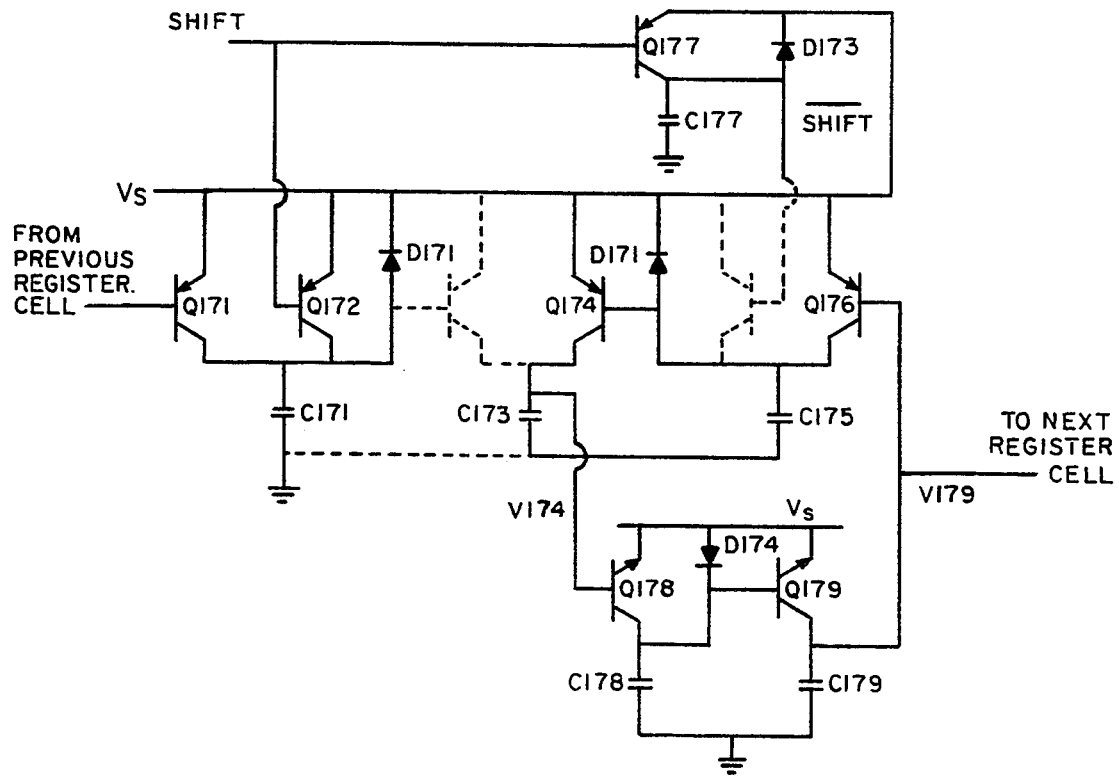
FIG. 17B and 17C illustrate two states of the circuit of FIG. 17A.

The selector is active during the rising portion of the power supply. Transistor Q177 performs the complement of the SHIFT input. If the control input SHIFT is low ($\overline{SHIFT}$ is high), then transistor Q172 will conduct, keeping transistor Q173 off. Then the circuit is essentially a pair of two transistor stages connected in a loop, as shown in FIG. 17B. Transistors Q173 and Q175, which are off, are shown in dotted lines for clarity. The voltage at node V179 is passed to node V174. During the falling portion of the power supply, the npn stage (Q178, Q179) passes this logical value to node V179.

Figure 17C:
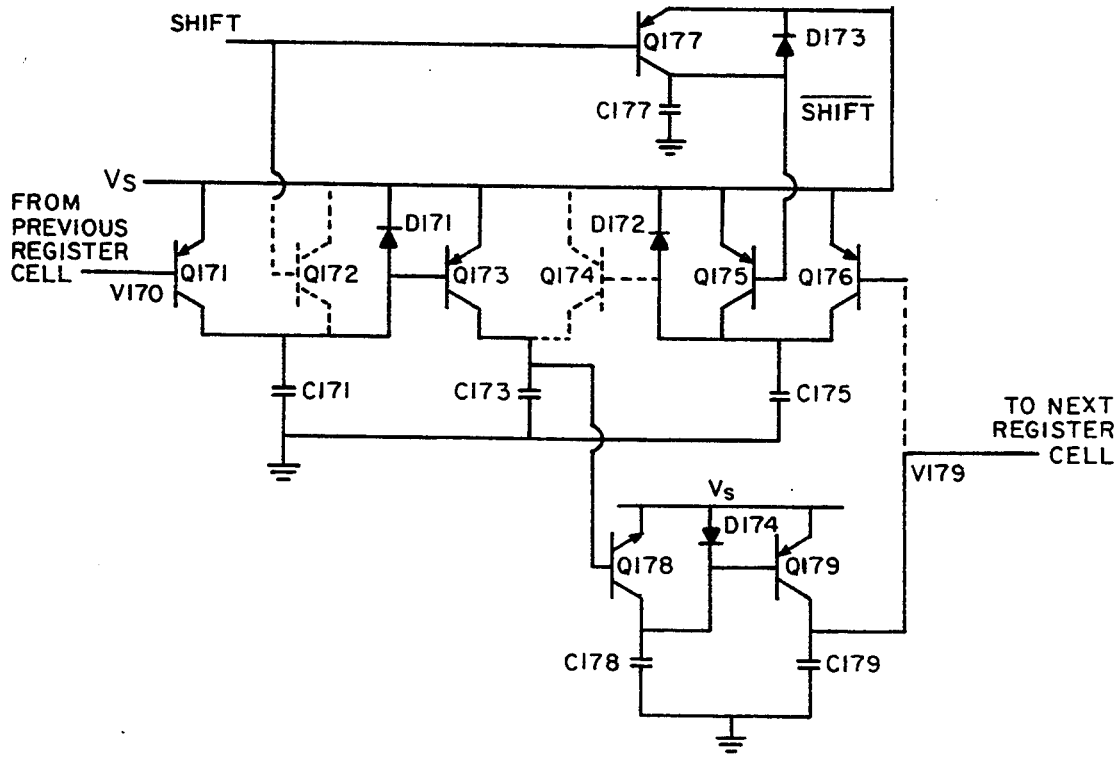

If the SHIFT input is instead high, then transistor Q175 keeps transistor Q174 from conducting. The circuit is then a pair of two transistor stages connected in series, shown in FIG. 17C with the off transistors (Q172 and Q174) in dotted lines. The pnp circuit transfers the voltage at node V170 to node V174 during the rising portion of the power supply, and a similar pnp structure connected to node V179 transfers that voltage to the next storage location of the shift register. During the falling portion of the power supply, the npn transistors transfer the logical value at node V174 to node V179, as before. Thus, depending upon the value of the SHIFT input, the data is either shifted to the next register cell, or is held in a loop structure.

Figure 18:
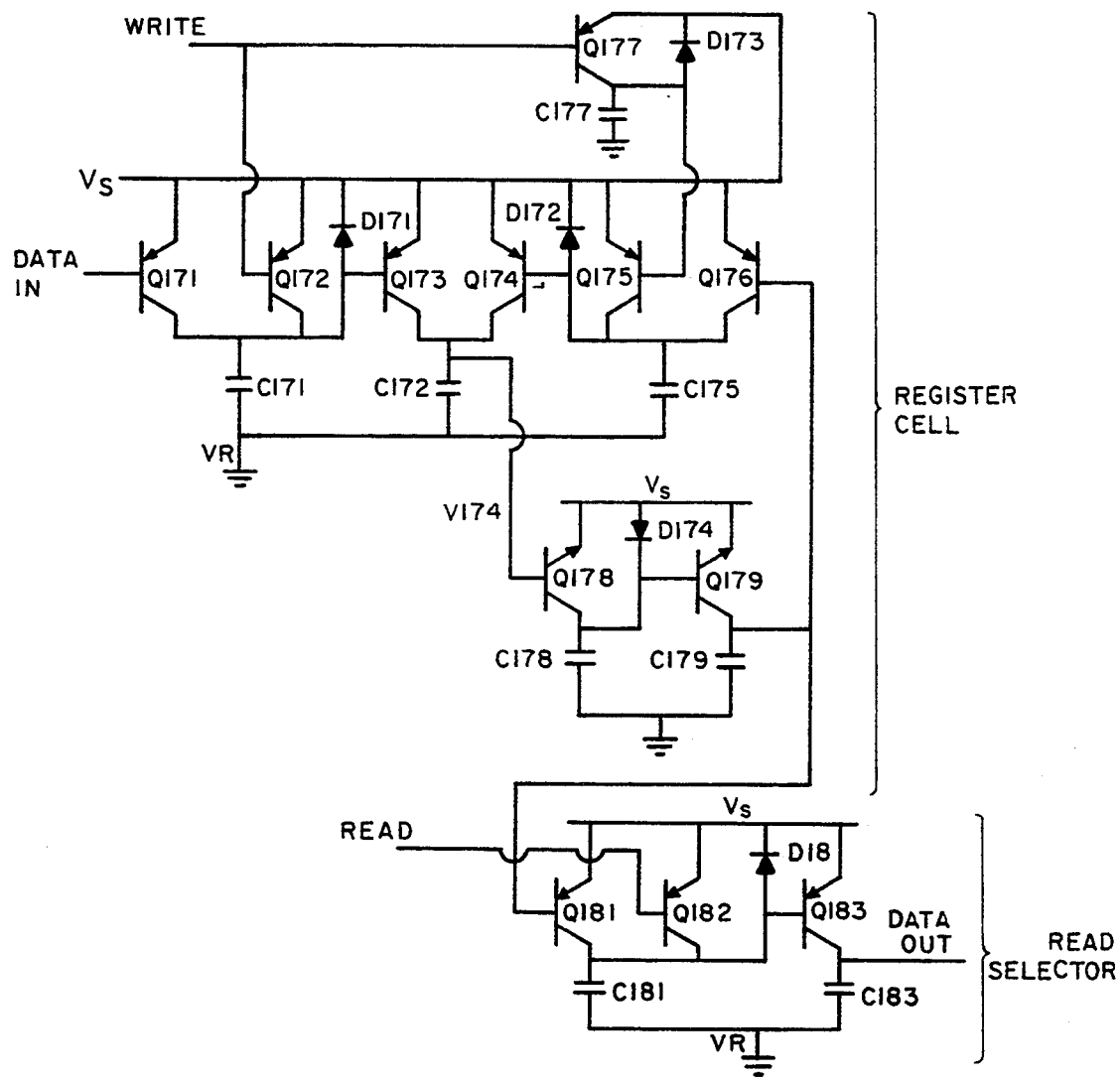
FIG. 18 is a circuit schematic of a readable memory cell having a READ selector coupled to its output.
Figure 19:
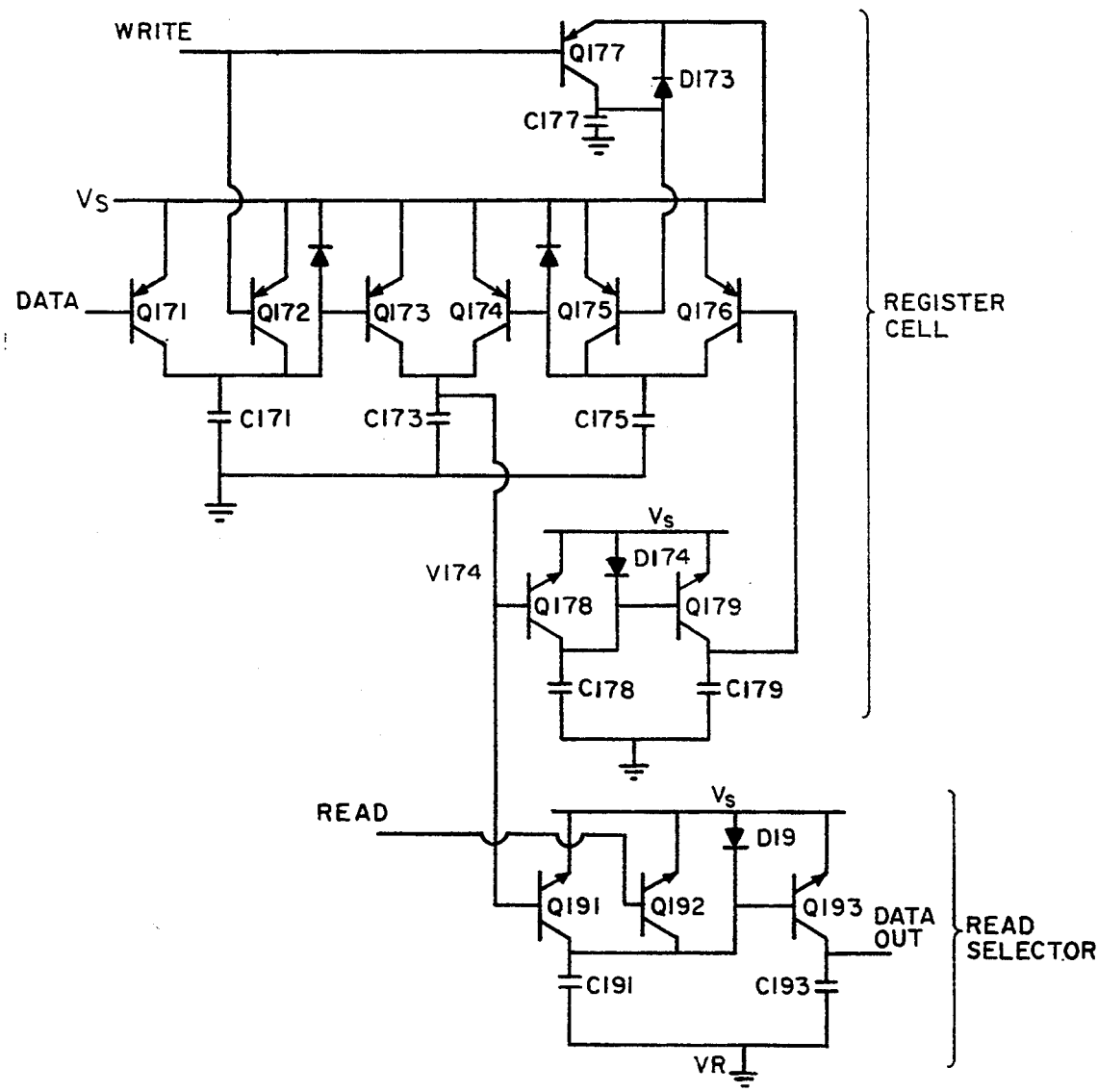
FIG. 19 is a circuit schematic of a memory cell having a READ selector coupled in parallel with a second logic stage of a register.

A static RAM cell for Recovered Energy Logic can be constructed in much the same way as one cell of a shift register. Two possible implementations are shown in FIGS. 18 and 19. The register cell (Q171–Q179) is exactly the same as a shift register cell. It holds its information when the loop is closed (WRITE input low). A new input is written into this cell by changing the state of the WRITE input before the rising portion of the power supply 29. The cell is read by an additional READ selector connected to the output of either the pnp or npn portions of the register cell.

FIG. 18 shows a pnp type read selector (Q181, Q182, Q183, D18, C181, C183). Stored data from the cell can be read out on the rising edge of the power supply waveform by pulling the READ line 34 high. The value at node V174 is then transferred to the data out line. When the READ line is low, transistor Q182 turns on, and prevents transistor Q183 from affecting the data output.

The other option is to read the data from the cell on the falling half of the power supply waveform by using the structure shown in FIG. 19. Once again, Q171–Q179 form a register cell, and Q191, Q192, Q193, D19, C191 and C193 forms a READ selector. In this case, the value of node V179 is transferred to the output during the falling portion of the supply if the READ line is low. If READ is high, transistor Q192 turns on, disabling transistor Q193. This arrangement allows a read operation during the falling time period of the power supply immediately following a write operation. Either style could combine the data-in and data-out lines, as long as proper protocols are used in reading and writing.

Technology Implementation—Bipolar Transistors

Figure 23:
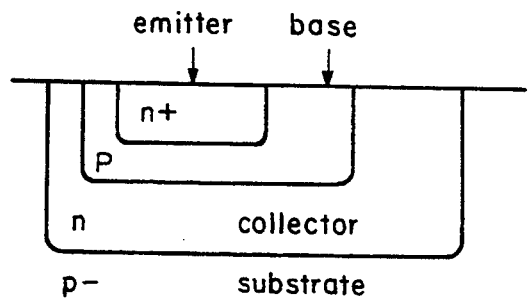
FIG. 23 is an illustration of a conventional vertically diffused npn transistor which may be used in implementing the present invention.

In order to understand the unique features of bipolar transistor fabrication for REL, it is instructive to review the methods used to create ordinary bipolar transistors. A common way to fabricate these devices is to diffuse impurities ("dopants") into the silicon surface. Typically each successive dopant diffusion is at a higher concentration than the previous one. This creates a structure like that of FIG. 23, where the concentration in the upper layers is greater than in lower ones. An npn transistor is shown as an example.

Figure 24A:
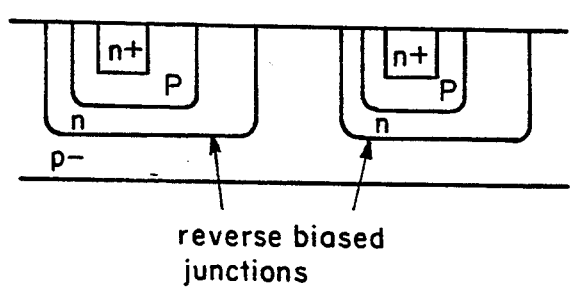
FIGS. 24A, 24B and 24C illustrate three conventional forms of isolation which may be used in implementing the present invention.
Figure 24B:
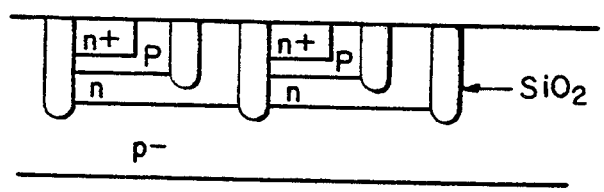

Several methods of isolating transistors from each other are shown in FIG. 24. FIG. 24A shows junction isolation. The substrate and collector regions are of opposite polarity types, thus they form a p-n junction.

Figure 24C:
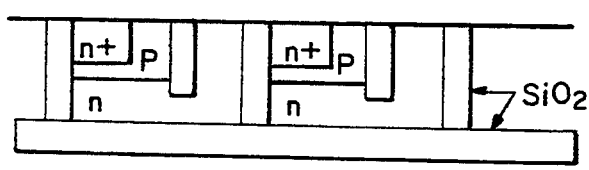

The substrate is connected to a bias voltage so that this junction is always reverse biased; thus the collector is isolated from the substrate and similar collectors nearby. Dielectric isolation, shown in FIGS. 24A and 24B, involves fabricating a trench (not shown to scale) in the silicon which is subsequently filled with silicon dioxide, an insulator. The substrate-collector junction in FIG. 24B must still be reverse biased. The oxide isolation permits closer packing of the transistors in the horizontal directions. FIG. 24C extends this concept to creating the entire transistor on an insulating surface in silicon-on-insulator (SOI) technology. Recovered Energy Logic can use all of these types of transistors. The load capacitance for these vertical transistors can often be made using the collector-substrate parasitic capacitance, especially if it is more than several times larger than other parasitic capacitances in the structure.

A specific variation which can be employed in the fabrication of REL arises for two reasons. First, the emitters of all the transistors in the logic circuit are connected. Secondly, most of the transistors do not require a high current gain, $\beta$, in order to operate well. A gain of around ten is sufficient in cases where the transistor only drives one to three other transistors (fan-out of 1-3).

Figure 25:
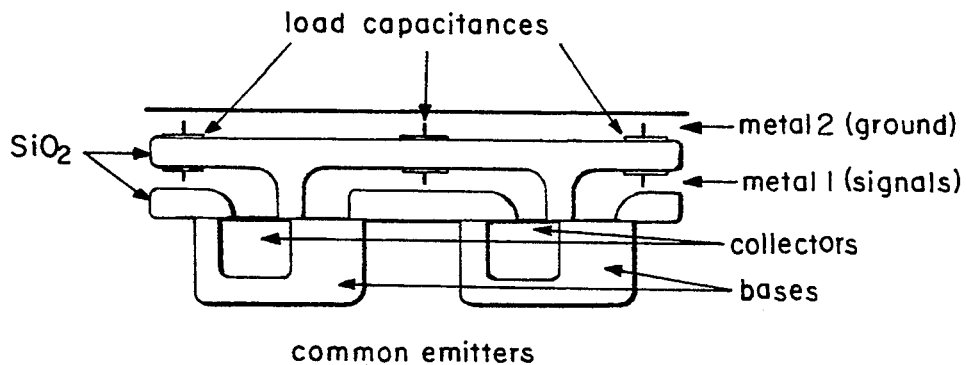
FIG. 25 is an illustration of a novel configuration of bipolar transistors particularly suited to implementing the present invention.

Since all the emitters are connected together, it is advantageous to build the REL transistors with their emitters on the bottom and their collectors on top, as shown in FIG. 25. This can result in a more compact structure because the REL emitters may be connected beneath the surface without metallization and surface connections to every transistor. The common emitters are coupled to the power supply $v_s$ through the back surface of the chip or through connections to the top surface. The load capacitances for the circuit are formed by the metal signal lines and a ground plane as shown in the figure. The advantage of this structure is that isolation is not needed between the emitters, only between the bases. This permits the devices to be fabricated in a smaller area. In fact, multiple stages of a given conductivity type may be placed in a common well. The transistors are self-isolating much in the same way as MOS transistors. One must still be careful to minimize the effects of parasitic thyristor structures, however.

In order to reduce power dissipation, it is desirable to have as low an on-state collector-emitter voltage drop (saturation voltage) as possible. A transistor which has collector and emitter dopant concentrations which are the same or nearly so accomplishes this goal. This is in contrast to conventional transistors, in which the collector is doped more lightly than the base, while the emitter is doped with the greatest impurity concentration.

Technology Implementation—Field Effect Transistors

REL may be implemented in technologies other than the bipolar junction transistors shown in the previous examples. Bipolar transistors are convenient because they are easily understood and because they have a base current to precharge the previous stage. Most any type of transistor, such as MOSFETs or MESFETs, may be used to construct these circuits. These field effect devices have gained popularity because they are self-isolating; all the devices of the same type can potentially be placed in the same well.

Figure 21A:
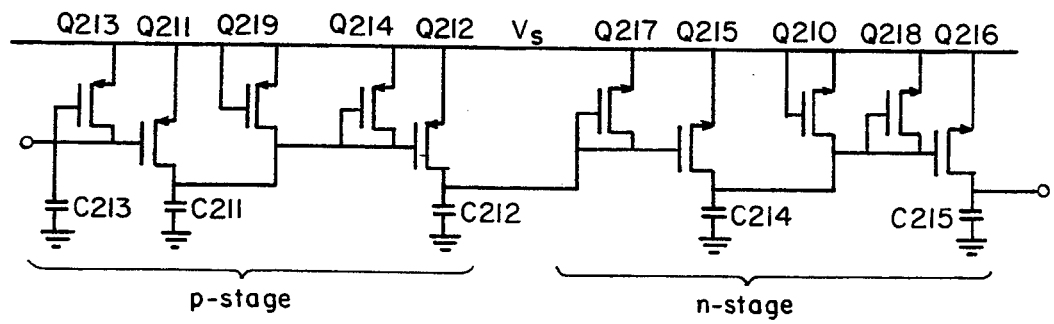
FIG. 21A is an illustration of two logic stages, each of two MOSFET transistors embodying the present invention and used for simulations.

An example of a chain of "two-transistor" stages fabricated in MOSFETs is shown in FIG. 21A. Strictly speaking, this stage does not consist of two transistors, because MOS devices do not have a gate current to correspond to a bipolar transistor's base current. It is therefore necessary to construct a "gate-source diode" using another transistor. Thus, the p-type stage of transistors Q211 and Q212 has gate-source diode transistors Q213 and Q214. The n-type stage has transistors Q215 and Q216 with base-emitter diode transistors Q217 and Q218. A junction diode could also be used in place of the diode-connected MOS transistor. In this case, the turn-on voltage of the diode must be less than the threshold voltage of the corresponding transistor to ensure that the latter conducts when necessary.

The precharging diode between the transistors may be implemented in a number of ways. It could be constructed of a fifth MOS transistor Q219, Q210 in the same well as the others. In certain processes it could be fabricated as an explicit p-n junction. Lastly, it could also be the substrate diode, which would be implemented by connecting the substrate to the source. This final configuration is not without dangers, however. If one wished to put the entire p-type stage in the same n-well, then the substrate diode would effectively be connected between the drain and source of all the transistors in that well. In order for the output transistor to operate correctly, that diode must not turn on before the succeeding n-type stage turns on. Therefore, the final transistor must either be in its own well, or the turn on voltage of the substrate diode must be greater than the voltage across the gate-source of an n-channel FET when it is on.

Figure 21B:
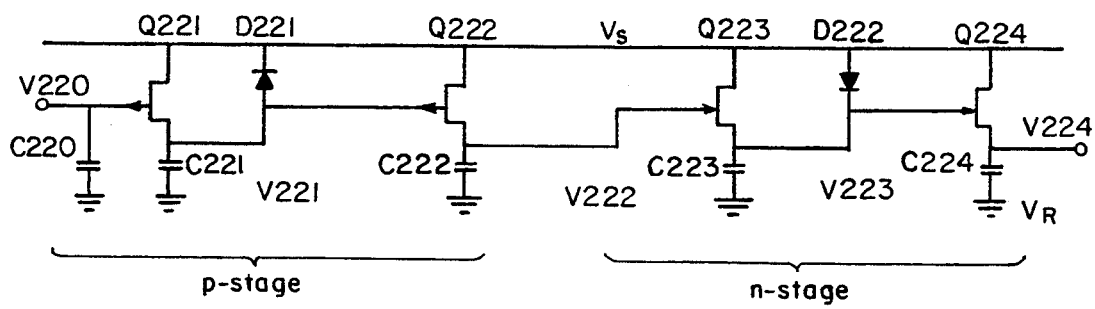
FIG. 21B is an illustration of two two-transistor stages formed in MESFETs.

MESFET and JFET transistors could also be used to create Recovered Energy Logic circuits. A circuit using enhancement-mode MESFETs is shown in FIG. 21B. A p-type stage comprises transistors Q221 and Q222 and an n-type stage comprises transistors Q223 and Q224. Enhancement mode devices are used because the transistors should be off when they are biased at zero volts. MESFETs are potentially more attractive than MOS devices because there is no need to explicitly fabricate a gate-source diode. When the gate to source voltage becomes great enough, the gate junction will turn on, and the input capacitor will be precharged. In most circuits, the designer must be careful to keep the voltage across this junction small to maintain low gate current. In REL, this gate current is desirable.

Power Dissipation

Real circuits cannot be dissipationless, which raises the question of how much energy Recovered Energy Logic will actually consume. This section will develop simple models for that energy dissipation which can then be used to compare to those of other logic families and to simulated dissipation. These models may then be refined further to match a particular implementation.

The power dissipation of a Recovered Energy Logic circuit is due to voltage drops in its active devices and parasitic resistances. Each time the power supply voltage rises or falls and a transistor turn on, there will be some dissipation in the process of charging the load capacitor. The energy lost is equal to the charge flowing through the device (and onto the capacitor) multiplied by the voltage drop:

$$E_{diss} = \Delta Q \cdot V_{drop}. \quad (1)$$

The key to making REL advantageous is to make this energy small. Let us find values, or at least reasonable estimates, for $\Delta Q$ and $V_{drop}$. In so doing, we will ignore any voltage drops in parasitic resistances.

If the capacitor is linear, the change in charge is simply proportional to the change in voltage across it, $\Delta Q = C\Delta V$. This would apply to the load capacitance formed between two metal layers. However, both the collector-substrate capacitance of a bipolar transistor and the drain-substrate capacitance of a MOS transistor are p-n junction depletion capacitances. Such capacitances could also be used as the load, for these capacitors, the change in charge is:

$$\Delta Q = 2\psi C_{j0} (\sqrt{1 + V_1/\psi} - \sqrt{1 + V_2/\psi}), \qquad (2)$$

where $C_{j0}$ is the zero voltage incremental capacitance, and $\psi$ is the built-in potential of the junction, $$\psi = \frac{kT}{q} \ln \frac{N_A N_D}{n_i^2} \qquad (3)$$

The voltages $V_1$ and $V_2$ are the initial and final voltages across the capacitor. Because the capacitance of the junction decreases as the reverse bias increases, the change in charge will be less than in a linear capacitor of capacitance $C = C_{j0}$.

The voltage drop across bipolar junction transistors is $V_{be,on}$ for the base-emitter junction and $v_{ce,sat}$ between the collector and emitter terminals. These voltages are logarithmically dependent upon the currents in the devices, it is useful to approximate them as constant. Since a circuit node corresponding to an output will be charged or discharged to within $v_{be}$ of one voltage extreme and $v_{ce,sat}$ of the other, $V_1 = v_{be}$ and $V_2 = V_p - v_{se,sat}$. Depending upon which transistors turn on, the intermediate nodes of a stage might only be charged to within $v_{be}$ of either node, so $V_2$ could be $V_p - v_{be}$ in this case.

Metal Oxide Semiconductor Field-effect transistors (MOSFET) have a weaker dependence of drain current on input voltage than bipolar transistors, so their "on" voltages are somewhat less constant. The on voltage of a diode connected MOS transistor is $$V_{gs} = V_T + \sqrt{\frac{2LI_{ds}}{W\mu C_{ox}}} = V_T + \delta V, \qquad (4)$$

where $\mu$ is the mobility of carriers in the channel and $C_{ox}$ is the gate oxide capacitance per unit area. In these logic circuits $$I_{ds} = \frac{d}{dt}(C(V) \cdot V), \qquad (5)$$

which changes over the course of the power supply cycle. A reasonable approximation of the drain current is $$I_{ds} \approx C_{j0} \frac{\Delta V}{\Delta t},$$

where $\Delta t = T/2$ is the time for one half clock cycle. As before, $\Delta V$ is the difference between the starting and ending voltages. It is not so easy to estimate the voltage drop from the source to the drain of the transistor which drives the output capacitor, because it changes considerably during the turn-on transition. For driving devices with W/L ratios similar or slightly bigger than that of the diode connected device, a voltage drop of $V_T$ is a good approximation.

It is interesting to contemplate how the energy dissipated can be reduced when circuit parameters are altered. There is a trend to reduce the supply voltage of CMOS logic in part because the power dissipation is proportional to $V^2$ and because this permits a reduction in feature size. Lowering the peak AC voltage will not reduce the energy consumption of Recovered Energy Logic so dramatically. Reducing Vp makes ΔQ, the charge stored on the load capacitance, smaller. This change is less than linear due to the nature of the nonlinear capacitance. In the MOS implementation of REL, the transistor on-state voltage will also be reduced because the necessary drain current is smaller (assuming the capacitance does not change).

The power dissipation of the REL circuit may also be reduced by lowering the voltage drop across the device. This is relatively simple to do with MOS devices, as the threshold voltage can be adjusted by altering the channel doping implant or by implanting a threshold shift charge. The gate-source "diode" voltage Vgs is reduced by the reduction in threshold. The gate drive voltage, δV, and the change in charge, ΔQ, increase slightly, because the change of capacitor voltage increases by about twice the decrease in threshold. It is more challenging to substantially lower the diode drop of bipolar junction transistors. One possible way is to fabricate heterostructure devices with a higher saturation current density, $J_s$, than is possible with homojunction transistors.

Simulations were performed to compare Recovered Energy Logic to clocked static CMOS. A chain of inverters was chosen as the basis for comparison. A two phase clocking scheme was employed to shift data from one stage to the next. For REL, this specified a chain of "two transistor" stages of alternating type implemented in MOS, where the two phase clocking is provided by the power supply, as illustrated in FIG. 21A.

Figure 22:
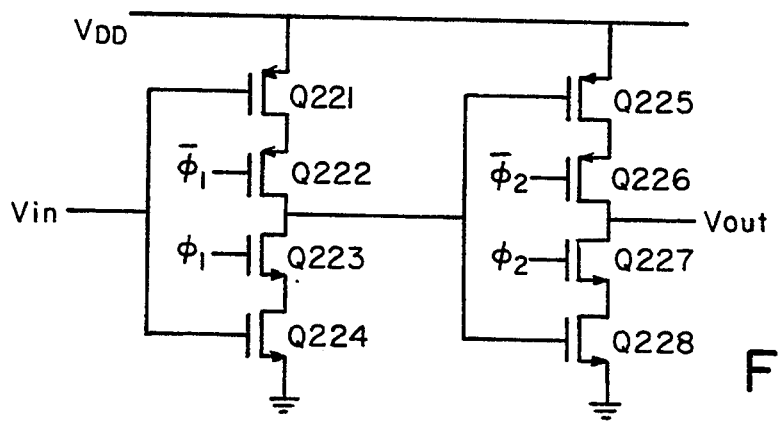
FIG. 22 is a schematic diagram of a CMOS circuit used for comparison in simulation.

The static CMOS circuit chosen was a "pseudo-two phase" chain consisting of static inverters separated by pass gates illustrated in FIG. 22. This circuit is ubiquitous in logic design due to its high noise margin and low power dissipation. Dynamic logic styles can offer increased speed, but at the expense of less immunity to noise and more difficult design. This circuit was chosen for a comparison because it is widely used.

The circuit is known as "pseudo two-phase" because it is necessary to have the complements of the non-overlapping phases $\phi_1$ and $\phi_2$. These complements may be generated locally, permitting the global distribution of only two clock lines with local distribution of four. The static CMOS circuit has its pass transistors inside the inverter structure to eliminate "shoot-through," the highly dissipative condition of having a conducting path between the power supply and ground.

These circuits were laid out using identical design rules, those for a two micron CMOS process with one layer of metallization. The results found here can be scaled to a process with smaller minimum feature sizes. The parasitic capacitances were extracted from the layout and used in the simulation files. The circuits were then compared on the basis of power consumption, speed, and area of the layout. The metric for power dissipation was the energy required to pass an input through a full clock cycle. In other words, it is the energy required to drive two stages, one on $\phi_1$ and the next on $\phi_2$.

The area required by the Recovered Energy Logic circuit is slightly larger than that necessary for the conventional clocked CMOS inverter. One inverter in static CMOS is 19 microns wide and 20 microns high. In addition, 30 microns of height is needed to route the power supply, ground, and clock wires, bringing the total to 19×50. By comparison, the REL circuit has a width of 46 microns and a height of 21 microns when laid out using minimum size driver transistors and long "diodes." If it were laid out using minimum size diodes and wider driving transistors for increased operating frequency, the width would be 70 microns.

The total load capacitances of the two circuits are similar, if one compares the capacitances of the clocked CMOS to the sum of the two capacitances for a stage of REL. This is not surprising, as the device areas are similar. The main difference is that the gate-channel capacitance figures more prominently in the load of the CMOS circuit than it does in REL. In REL the gate voltages tend to be changing at about the same rate as the source voltages, thus the effect of Cgs is minimized. The load capacitance for the first stage in FIG. 22 is $$C_L = 2C_{gbQ225\&Q228} + 2C_{gs/ovlQ225\&Q228} + C_{dbQ222} + C_{dbQ223} + C_{poly} + C_{metal} = 52fF \quad (6)$$

The load for subsequent stages has the same value. In the REL circuit, the load capacitance C211 consists of the drain-substrate capacitances of Q211, Q129 and Q214 plus any parasitic capacitance form the polysilicon or metal interconnect. Similar expressions can be created for the load capacitances at the other circuit nodes. C211, C212, C213 and C214 are 36, 48, 39 and 13 fF, respectively.

The peak-to-peak AC voltage and the CMOS supply voltage for this comparison were 5 volts, and the clocks operated at a frequency of 10 MHz. The two REL buffers dissipated about 810 fJ over the course of the four test cycles. That is about 202 fJ each time the power supply rises and falls, regardless of the state of the gates. On the other hand, two CMOS inverters consumed 1300 fJ during the clock cycles when their states were changing, and zero energy when they remained constant. Thus 2600 fJ were used during the four test cycles. In addition, each clock phase (pair of clock lines) dissipates 230 to 290 fJ each time it is asserted. The clocks require energy whether the state is changing or constant. Disregarding the clocks, REL has about 3.2 times less power dissipation, assuming that the test transitions approximate an actual logic circuit. If one considers the clocks, however, Recovered Energy Logic is better by a factor of 5.8 ((290+230)·4+2600=4680 fJ) in this comparison.

Power Supply

The power supply for an REL circuit is required to provide an alternating voltage waveform and should be capable of supplying and absorbing energy from its load, the logic circuit. Since the power supply voltage is also the system clock, its frequency should also be high, 10 MHz or greater for a commercially useful system.

The use of an AC power supply has the added advantage of easing the task of stepping down the voltage from line voltage to that required by the logic circuitry. In a conventional AC to DC conversion to five volts DC, for example, the diode drop of diodes used in the converting rectifier can be significant compared to the final voltage. However, with the present invention the DC voltage to the series inverter power supply can be relatively large (i.e., 48 volts). This allows the conversion from line voltage to this intermediate DC voltage to be made in an efficient manner. Furthermore, the voltage is stepped down to the low levels needed for logic circuits through a stepdown transformer in an AC to AC conversion, which has no diode drops.

The capacitance which a logic chip presents to the power supply is both non-linear and time-varying. It is composed of non-linear junction capacitances and switches which depend on the logical state of the circuit. The simplest way to model a Recovered Energy Logic chip is to aggregate all the load capacitors into one equivalent linear capacitor (C262 in FIG. 26). All the transistors and diodes are modelled as two anti-parallel diodes D261 and D262. An additional capacitor C261 is included to model capacitance which does not hold logical information, but which must be charged and discharged by the power supply. This capacitance can come from parasitic capacitances between the supply metallization and the substrate or from the source-substrate junction capacitance in a MOS implementation. This model does not account for different logical states of the chip.

Figure 26:
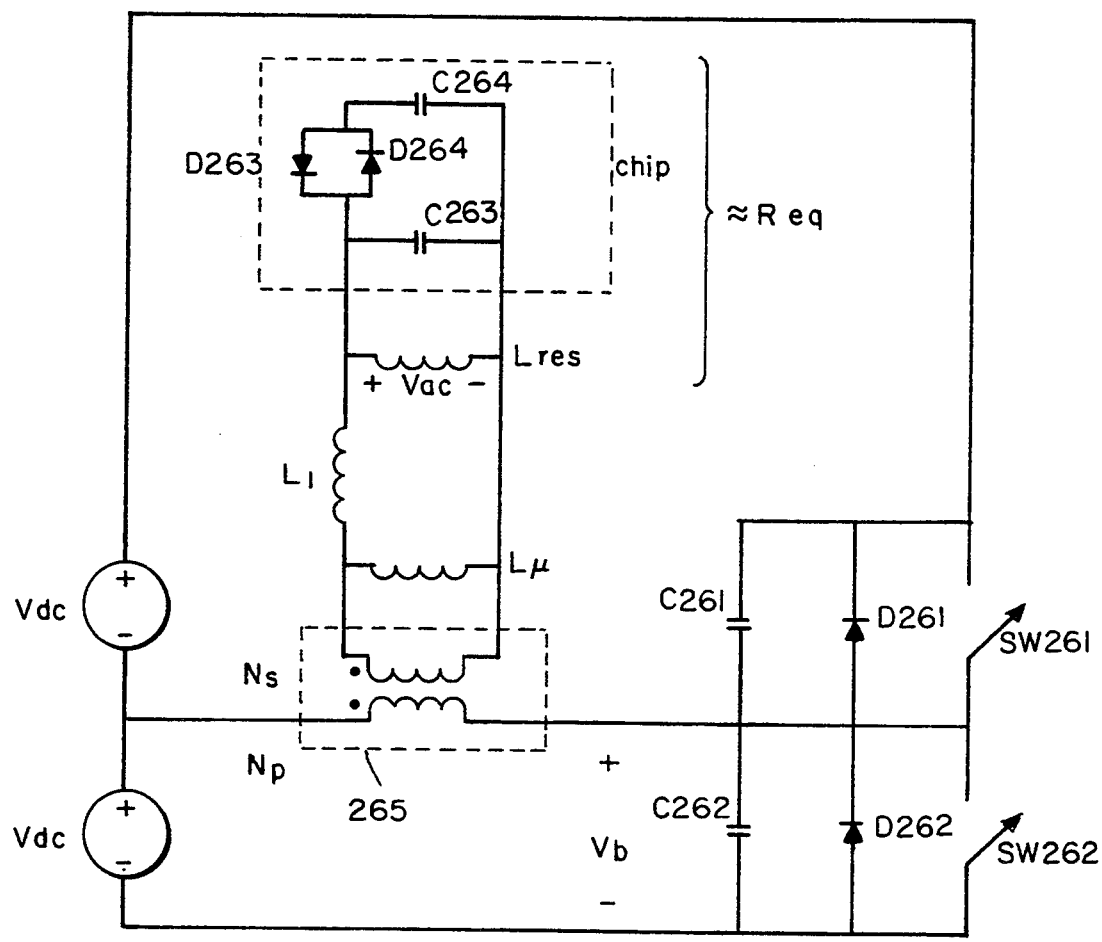
FIG. 26 is an electrical schematic of a preferred power supply circuit.

A preferred power supply and load is a parallel resonant circuit driven by a switching power supply as shown in FIG. 26. The energy recovered from the load capacitors is stored in the magnetic field of a parallel resonant inductor $L_{res}$. This inductor should be closely coupled to the chip, and with advances in integrated inductor technology, could be placed on top of the logic circuit die. Because the reactive power is handled by this inductor, the inverter circuit need only supply the power dissipated in the logic circuit and in the inductor, which is not lossless. This minimizes the current and thus the conduction losses in the switches of the supply. When operated at the resonant frequency, the logic circuit and its resonant inductor should appear resistive. (However, there are harmonic components of the waveforms which are not at the resonant fequency due to the nonlinear nature of the logic circuits.) This suggests a further simplification of the model, replacing the logic circuit and resonant inductor with a parallel RLC circuit, or just an equivalent resistor. The resistor approximately models the dissipation in the semiconductor devices on the chip.

If the alternating voltage has a DC component, means (such as a blocking capacitor) should be provided to avoid placing this DC voltage across the inductor. One implementation of the switching supply is a voltage source series resonant converter, which is the topology shown in FIG. 26. A simplified treatment of such a converter would consider the logic circuit and its resonant inductor as the equivalent resistance $R_{eq}$ and would use its own resonant elements to provide an alternating voltage to the chip. This allows the resonant inductor to be separate from the transformer (although it does not need to be) and thus not dependent upon the required turns ratio. This also has the advantage that multiple chip-inductor pairs may be placed in parallel and all operate at the same supply voltage. The series inductance $L_1$ is a combination of the transformer leakage inductance, and any parasitic inductance in the power distribution network. The magnetizing inductance of the transformer is modelled by $L_\mu$. The transformer 265 is an ideal transformer.

Let us consider an example chip to get a feeling for the value of these components. Assume there are 50,000

"two transistor" stages on this particular chip. If we use a sample 2 micron MOS process, the REL chip would have total capacitances of $C_1=2.15$ nF, $C_2=3.4$ nF. The total area for the chip would be at least $32\times 10^6$ $\mu m^2$, or could fit into a chip 5.7 millimeters on a side. Let us take 5 nanofarads as a round value for both C261 and C262. The requisite inductance is given by (7) and equals 25 nH for a frequency of 10 MHz and 1 nH for a frequency of 50 MHz. Controlling this small inductance and minimizing parasitic inductances which could be of similar magnitude is important.

$$L_{res} = \frac{1}{\omega^2(C_1 + C_2)}. \quad (7)$$

Figure 27A:
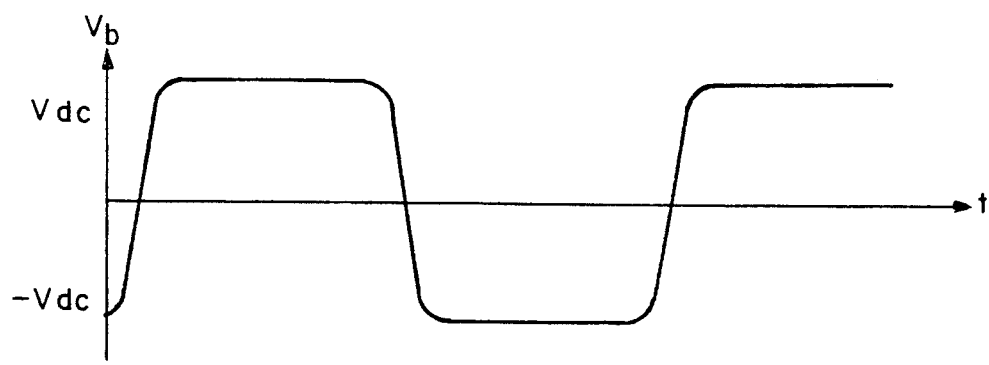
FIG. 27A and 27B illustrate idealized waveforms of the circuit of FIG. 26.
Figure 27B:
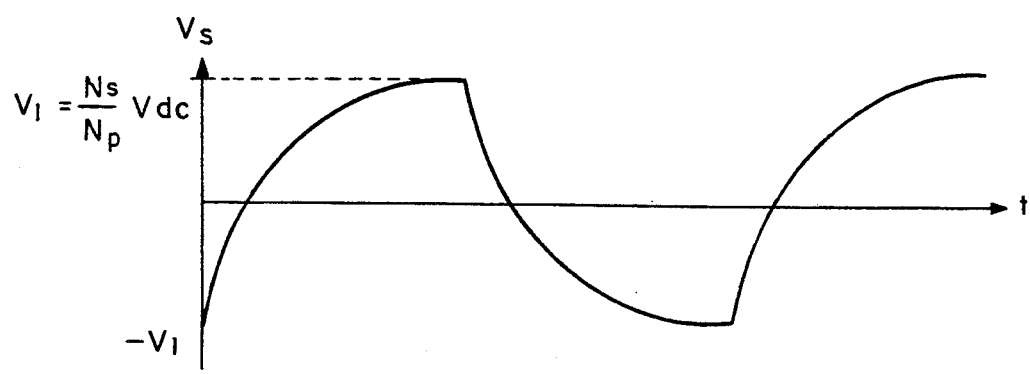

Idealized waveforms are shown in FIG. 27 to describe one operation mode of the converter. The circuit begins by closing Switch SW261, forcing a current to flow through the transformer 265 and the load resistor Req. One half cycle is about four times the time constant $L_1/R_{eq}$ associated with the leakage inductance and the load. Thus the voltage at the load approaches $V_{dc}N_s/N_p$. Switch SW261 opens and a resonant circuit is formed between the leakage inductance $L_1$ and the parasitic capacitances C261 and C262 of the MOS switches. The initial current in the inductor drives a ring which pulls the node between the switches ($V_b$) to $-V_{dc}$. This voltage is clamped by the body diode D264 of Switch SW262, so that the MOS portion of Switch SW262 may turn on with zero voltage across it. The polarity on the load is then reversed, so the current builds up in the opposite direction. Eventually, Switch SW262 opens, ending the second half cycle.

The relevant equations used to design this power supply relate the load time constant to the desired switching period, and the change in voltage at the intermediate node to the current in the leakage inductor when the switches open.

$$L_{ls}/R_{eq} = T/8 \quad (8)$$

$$I_{los}\sqrt{\frac{L_{ls}}{2C_{sws}}} \geq 2V_{dc} \quad (9)$$

$$I_{los} = v_i/R_{eq} \quad (10)$$

In these equations, the subscript "s" denotes values referenced to the secondary side of the transformer. A converter for a single chip would need the total secondary side series inductance to be less than 90 nH for operation at 10 MHz and 3.6 nH at 50 MHz. The parasitic capacitance of the semiconductor switches must be less than 0.2 nF, when referenced to the secondary side. If a single converter were to drive several chips, the maximum series inductance is correspondingly less, increasing the difficulty of the problem. However, the constraint on the parasitic capacitance of the switches can be relaxed. The transformer magnetizing inductance may be made as large as possible and the magnetic flux density in the core can be kept low, so that core loss is not a large loss mechanism.

This converter can also be operated with a slightly different control scheme. Instead of waiting for $v_s$ to approach $V_{dc}N_s/N_p$ before opening SW261, the switches are operated independent of the exact value of the load voltage. This approach acknowledges that the chip and its resonant inductor are not modelled well by a resistor alone—the RLC model is needed. We consider only the sinusoidal steady state of the fundamental frequency. In this case, the impedance of the leakage inductance $L_1$ at the switching frequency should be small compared to the impedance of the load so that most of the supply voltage appears across the load. The leakage inductance should thus be minimized in this implementation.

Figure 28:
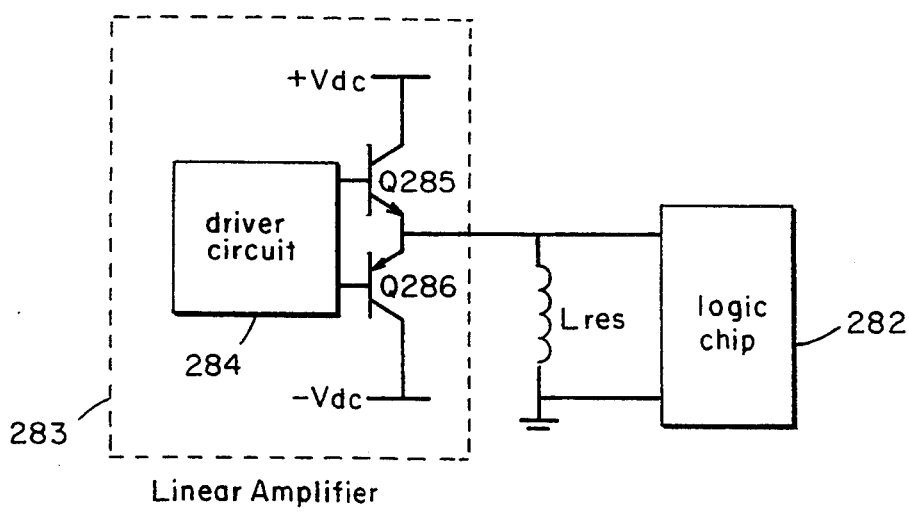
FIG. 28 is an illustration of an alternative power supply for use with the present invention.

The preferred embodiment for the circuit which supplies power to REL is most likely a "power circuit", one in which there is ideally zero power dissipation. However, it would be possible to use a linear amplifier circuit, one which dissipates power in the ideal case, as the source of AC power. This is the approach used to drive the clocks in most, if not all, logic systems. The advantages of using a linear amplifier for REL are reduced complexity and increased waveform control, perhaps without much of an increase in power dissipation. The design of a linear circuit to supply a high frequency signal is simpler than that of a power circuit because one need not try to minimize power losses. The waveform may be shaped to a much wider degree for the same reason. The resonant inductor L281 from the power circuit would be retained to shunt the peak currents from the logic chip(s) 282 as shown in FIG. 28. A linear amplifier circuit 283 including a driver circuit and output transistors Q285 and Q286 would supply the necessary voltage waveform. By resonating the chip and inductor we reduce the power which must be dissipated in the linear amplifier. Ideally its efficiency could approach 78% compared to a power circuit with an efficiency above 80% and more likely 90%. The linear amplifier power supply is particularly advantageous when placed on the same semiconductor chip as the logic circuitry.

Magnetic Components

It is desirable to place the resonant inductor as close to the logic circuit as possible to minimize the inevitable parasitic inductances and the distance the currents must circulate. This inductor could be placed either near the logic chip or on its surface. As the operating frequency increases, a smaller inductor (both physically and in inductance value) is needed; at about 100 MHz an air core inductor is compatible with the size of integrated circuit die. "Air core" refers to a structure in which the magnetic fields are contained in a non-magnetic material, such as air. The other type is a magnetic core, one in which the fields are contained in a high permeability material. Examples of such materials are iron, nickel, cobalt, amorphous alloys of such metals, and ferrites (ceramics of iron oxide and other materials). High permeability materials permit a reduction in the size of inductors over the air core type, often with an increase in losses. While current technology does not permit fabrication of high quality inductors on the same chip as conventional circuitry, it is an area of active research, and this capability is expected in the near future.

The other advantage of building the inductor on the same chip as its logic circuitry is one of manufacturing. The inductor may be tuned in the design phase to the exact value necessary and may be fabricated accurately using lithographic techniques. Furthermore, the logic and inductor become a single unit, simplifying the design of larger systems.

There has been an effort in recent years to reduce the dimensions of transformers and inductors used in power and signal circuits. The approaches used vary widely, from miniaturized pot core structures to integrated circuit style fabrication techniques. There is also some variation in the materials used to construct these transformers. The typical materials for high frequency converters have been nickel-zinc and manganese-zinc ferrites. The low conductivity of these materials means that eddy current losses are small. Resonance in the domain walls begins to dominate losses when the operating frequency reaches the range of 1 MHz for MnZn and 10 MHz for NiZn, and precludes their use at higher frequencies. A good review of many of these transformer construction methods and work on ferrite components for use in the 1 to 10 MHz frequency range is found in A. F. Goldberg, "Development of Magnetic Components for 1–10 MHz DC/DC Converters." PhD thesis, Massachusetts Institute of Technology, September 1988.

More recently researchers have made transformers for switching power supplies using thin films of amorphous magnetic alloys like cobalt-zirconium and conductors sandwiched together (K. Yamasawa et al., "High-frequency operation of a planar-type microtransformer and its application to multilayered switching regulators," *IEEE Trans. Magnetics*, vol. 26, no. 3, pp. 1204–1209, May 1990 and Y. Yachi et al., "A new planar microtransformer for use in micro-switching-converters," in *Power Electronics Specialists Conference Record*, Piscataway, N.J., pp. 2026, IEEE, 1991).

Distribution of Power

There are several issues that must be considered when constructing a circuit board with any logic technology. It is important that the power supply be distributed without significant voltage drops. The clock signals must be nearly synchronized across the board. Parasitic impedances associated with the construction of the circuit board thus set limits on the size of the board which may be successfully built. At low frequencies, this is usually not restrictive. However, the delays associated with circuit traces can become appreciable when the frequencies involved are above 1 MHz.

Because the power supply voltage serves as the clock signal in REL, both the voltage drops and the delays must be small in order for the circuit to function properly. Suppose we distribute the power and ground in adjacent copper layers of a multilayer circuit board. This system may be modeled as a parallel plate waveguide carrying only the lowest order mode, the "TEM" mode. The wavelength in this guide is just the wavelength of electromagnetic radiation in the dielectric material, $\lambda = 1/(f\mu\epsilon)$. Assuming that the material is non-magnetic and has a dielectric constant of 7, then at 10 MHz the wavelength is about 11 meters. The phase difference between two ends of a thirty centimeter long board is therefore very small. On the other hand, the wavelength at 50 MHz is about 2.25 meters, and the phase difference between two points thirty centimeters apart is about 48 degrees, a fairly significant amount.

Another concern is that the peak voltage for all the chips on the board must be essentially the same. If the impedance along the supply line is large enough with respect to the chip impedances, then the voltage drop can be too large. Again, we model the distribution system as a parallel plate transmission line. Logic chips spread out along the line are modeled as a non-zero conductivity in the dielectric material. When the transmission line is made of conductors with finite conductivity and dielectric with non-zero conductivity, the amplitude of the voltage waveform decays exponentially as a function of length, $$V(l) = V(0) \exp(-bl) \tag{22}$$

where the constant "b" is composed of two terms, the first corresponding to copper resistance and the second to dielectric leakage.

$$b \approx \frac{1}{a} \sqrt{\frac{\omega\epsilon}{2\sigma_{Cu}}} + \frac{a}{2WR_{eq}l_m} \sqrt{\frac{\mu}{\epsilon}} \tag{23}$$

We model logic chips distributed along the transmission line as a conductivity between the parallel plates. Here $R_{eq}$ is the equivalent resistance of a logic chip and its resonant inductor, $l_m$ is the spacing between chips, a is the spacing between conductors, and W is the width of the transmission line.

As an example, let us consider a board 10 cm wide with a number of chips similar to those discussed above spaced about 2 cm apart. Let the spacing between the copper layers be 100 microns. For the case we have been considering, the equivalent resistance, $R_{eq}$, is about 12 ohms at 10 MHz, and 2–5 ohms at 50 MHz. We have been using a value of 2.5 volts for the amplitude of the sinusoidal supply voltage, $v_i = V_{p/2}$, so we can tolerate a drop down to 1.8 volts. This means that the circuit board could not extend farther than 91 cm away from the power supply at 10 MHz, or longer than 21 cm at 50 MHz. These lengths are limited by the second term in b, so that longer distances could be obtained by using a wider waveguide with less spacing between the plates, or a higher dielectric constant.

Parasitic inductances in the power distribution network must be closely controlled, for they are in series with the controlled leakage inductance in the power supply. This leakage inductance can be as small as a few tenths of a nanohenry if necessary by reducing the spacing between the windings to about 10 micrometers. If we model the distribution network as in the previous section, the total inductance is approximately given by (24).

$$L_{board} \approx \frac{\mu_0 a l_{tot}}{W} \tag{24}$$

Using the same width and spacing and assuming a total length of 20 cm, we arrive at an inductance of 0.024 nH. The parasitic inductance of a wire bond or a TAB structure is about 1 nH.

At an operating frequency of 50 MHz, 1 nH of resonant inductance is required for circuit operation. As this inductance must be in parallel with the chip power supply pins and a bond wire would be in series, it would be best to fabricate the resonant inductor on the chip, or in a special package with the die. The parasitic board and wirebond inductances will be in series with the leakage inductance. Therefore, the chip lead inductance must be as closely controlled as the leakage inductance of the driving transformer. With many chips or leads in parallel, this lead inductance will be reduced, but will still be a significant proportion of the total necessary. Solder-bump mounting techniques may be used to reduce this parasitic inductance. A solder bump connection has an inductance less than 50 pH.

Figure 29A:
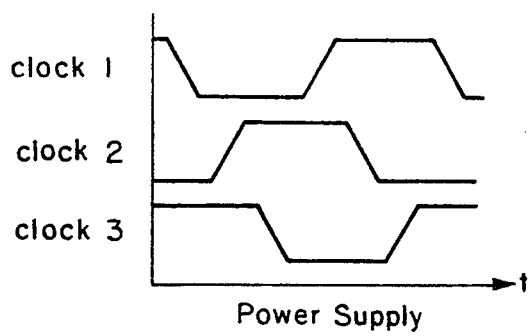
FIG. 29A illustrates a power supply waveform in a three-phase implementation of the present invention.
Figure 29B:
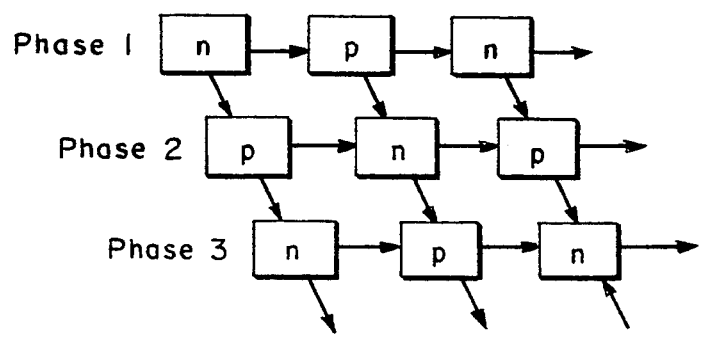
FIG. 29B illustrates communications between logic stages in a three-phase implementation.

Although we have discussed REL in the context of a single power supply waveform, multiple waveforms may be used. The single power supply creates a two phase non-overlapping clock for the logic circuit. In some logic systems, it could be useful to have other clocks at different phases or frequencies or shapes to initiate tasks at intermediate times or alternate time intervals. For example, with the three power supply system shown in FIG. 29A, there could be six different kinds of logic gates: p-type and n-type for each supply phase. The system provides flexibility to the logic designer because a logic gate can pass information onto two different types of logic gates: the opposite type gates on the same and the subsequent clock phase (FIG. 29B).

Multiple clock phases from on-chip power supplies make it possible to have the energy that is recovered from one set of logic stages be delivered immediately to another set of logic stages, so the resonant inductors can be reduced in size or eliminated.

Figure 30:
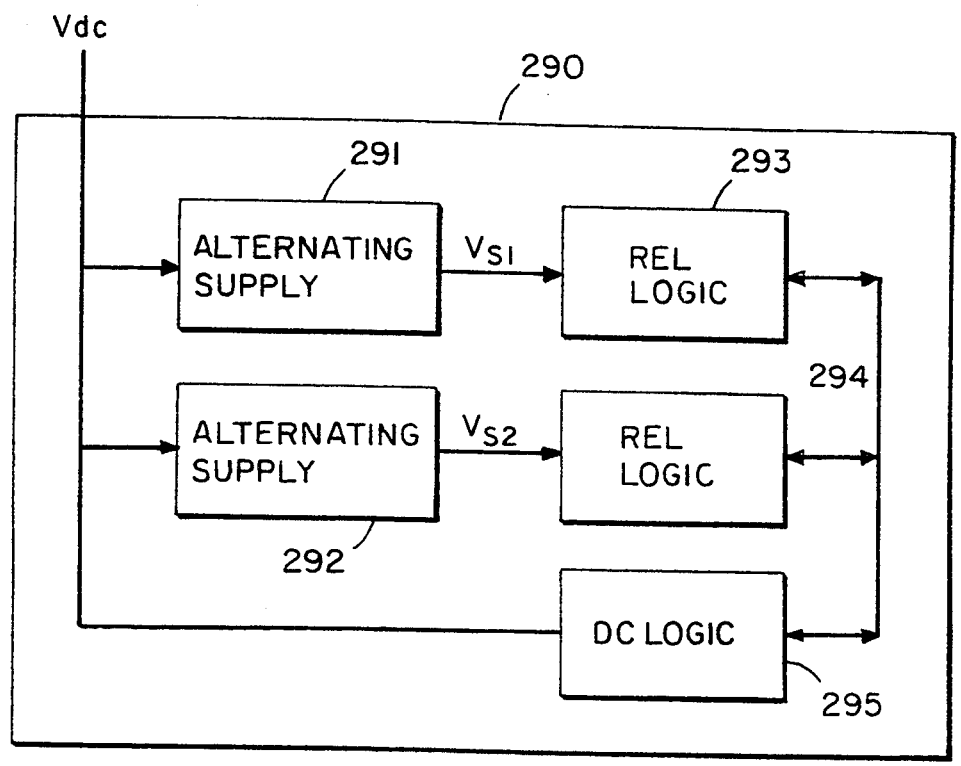
FIG. 30 illustrates a logic chip having multiple power supplies thereon.

FIG. 30 illustrates a semiconductor chip 290 having two portions 291 and 292 of the power supply formed thereon. Those portions of the power supply are driven by the DC voltage $v_{dc}$ applied to the chip. Two supply voltages $v_{s1}$ and $v_{s2}$, preferably 90° out of phase, are supplied to respective REL logic circuits 293 and 294. As illustrated at 295, the chip may support conventional DC logic. The several logic circuits may communicate as illustrated.

Figure 31:
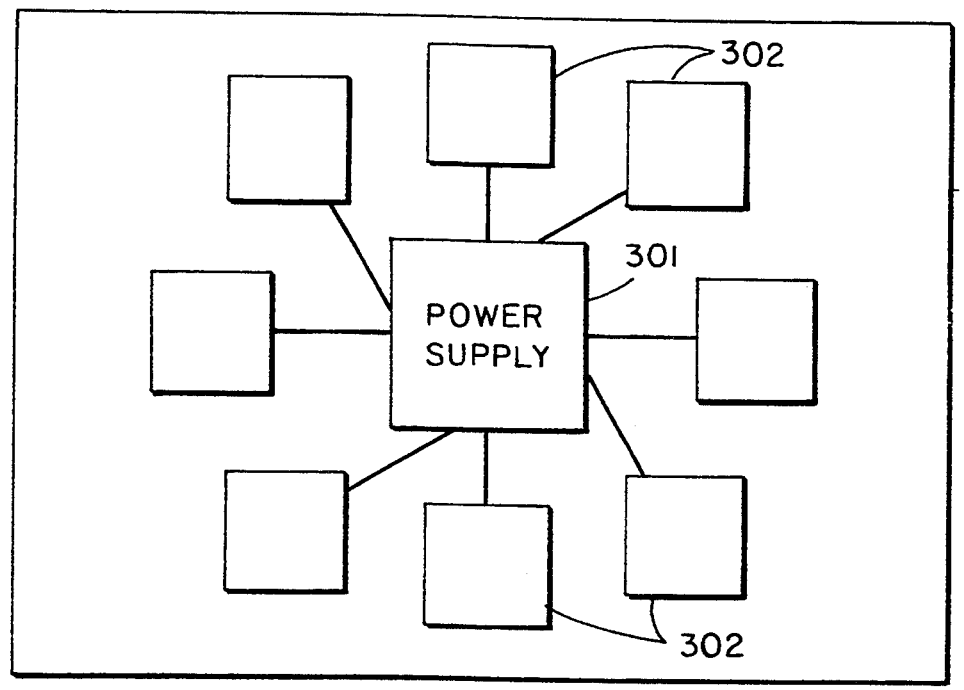
FIG. 31 illustrates a cluster of logic chips surrounding a power supply in an embodiment of the present invention.

In order to minimize phase shifts between logic chips supplied from a common power supply, a number of chips may be mounted on a circuit board in a cluster about a common power supply. As illustrated in FIG. 31, the module includes a cluster of logic chips 302 surrounding and supplied by the supply 301.

While this invention has been particularly shown and described with references to preferred embodiments thereof, it will be understood by those skilled in the art that various changes in form and details may be made therein without departing from the spirit and scope of the invention as defined by the appended claims. For example, although a principal advantage of the present invention is the reduction in power requirements, the use of an AC supply has other advantages such as minimizing electromigration in a high density circuit.

Further aspects of the invention are presented in the Massachusetts Institute of Technology Doctoral Thesis of Roderick T. Hinman, "Recovered Energy Logic: A Logic Family and Power Supply Featuring Very High Efficiency," May 1994, which is incorporated herein by reference.

We claim:

1. A logic circuit comprising:
a power supply which applies a single alternating voltage to a plurality of successive logic stages; and
said plurality of successive logic stages, the logic stages switching states in synchronization with the supply such that changing voltage levels within the logic stages closely follow changes in voltage of the supply to reduce capacitive charging and discharging energy losses in the logic circuit.

2. A logic circuit as claimed in claim 1 wherein rise and fall times of the alternating voltage of the power supply are greater than or equal to substantially all RC time constants of the logic stages.

3. A logic circuit as claimed in claim 1 wherein successive logic stages are alternately activated by the power supply in logical processing of respective inputs during respective rising and falling portions of the power supply waveform.

4. A logic circuit as claimed in claim 3 wherein successive logic stages comprise switchable semiconductor devices of opposite conductivity types.

5. A logic circuit as claimed in claim 3 further comprising means for precharging each logic stage during portions of the power supply waveform in which the stage is not active in logical processing.

6. A logic circuit as claimed in claim 1 wherein successive logic stages comprise switchable semiconductor devices of opposite conductivity types.

7. A logic circuit as claimed in claim 1 further comprising means for precharging each logic stage during portions of the power supply waveform during which the stages are not active in logical processing.

8. A logic circuit as claimed in claim 7 wherein the output of each logic stage is precharged by an input device of each next stage.

9. A logic circuit as claimed in claim 1 wherein logic stages comprise basic logic elements, a basic logic element comprising:
an input transistor coupled to conduct between a first precharged capacitor and the power supply;
a second transistor coupled to conduct between a second precharged capacitor and the power supply, the second transistor being inhibited by a change in charge on the first capacitor due to conduction through the input transistor; and
means for precharging the precharged capacitors when the stage is not active in logical processing.

10. A logic circuit as claimed in claim 9 wherein the second precharged capacitor is an output capacitor which is precharged by a succeeding stage.

11. A logic circuit as claimed in claim 9 further comprising a third transistor coupled to conduct between a third precharged capacitor and the power supply, the third transistor being inhibited by a change in charge on the second precharged capacitor due to conduction through the second transistor.

12. A logic circuit as claimed in claim 9 further comprising a second input transistor coupled to conduct between the first precharged capacitor and the power supply waveform.

13. A logic circuit as claimed in claim 9 further comprising plural basic logic elements coupled in parallel to drive a common output.

14. A logic circuit as claimed in claim 9 wherein a register stage comprises successive logic stages, the first logic stage comprising first and second selector circuits the first selector circuit selecting an external input to the register stage and the second selector circuit selecting an output from the second logic stage as an input to the first logic stage, each selector circuit comprising a basic logic element having first and second input transistors coupled in parallel to conduct between the first precharged capacitor and the power supply waveform.

15. A logic circuit as claimed in claim 14 wherein the register stage is a readable memory, the register stage further comprising a read selector circuit.

16. A logic circuit as claimed in claim 14 wherein the register stage is coupled in series with a plurality of like register stages in a shift register.

17. A logic circuit as claimed in claim 1 further comprising an inductor coupled across the alternating voltage power supply in parallel with the successive logic stages such that the inductor and logic stages resonate to appear as a high impedance across the alternating voltage power supply.

18. A logic circuit as claimed in claim 17 wherein the inductor and successive logic stages are formed on a common semiconductor chip.

19. A logic circuit as claimed in claim 17 wherein logic stages are formed on a plurality of chips which are clustered in a module with a common power supply.

20. A logic circuit as claimed in claim 17 wherein the alternating voltage power supply comprises a switching circuit and a step-down transformer for converting a DC input to the alternating voltage.

21. A logic circuit as claimed in claim 1 wherein the logic stages are formed on a semiconductor chip having a power supply connection on a surface of the chip opposite to a surface of the chip on which logic interconnections are formed.

22. A logic circuit as claimed in claim 1 wherein:
the power supply generates plural alternating voltage waveforms; and
said plurality of successive logic stages comprise a first plurality of logic stages driven by a first voltage of the waveform power supply and a second plurality of successive logic stages driven by a second voltage of the waveform power supply.

23. A logic circuit as claimed in claim 22 wherein the first and second voltage waveforms are phase shifted relative to each other.

24. A logic circuit as claimed in claim 23 wherein the successive logic stages and a portion of the power supply which generates the plural alternating voltage waveforms are formed on a common semiconductor chip.

25. A logic circuit as claimed in claim 24 wherein the power supply is a linear amplifier power supply.

26. A logic circuit as claimed in claim 1 wherein the power supply is a linear amplifier power supply.

27. A logic circuit as claimed in claim 1 comprising an inductor for storing energy recovered from the logic stages and returning most of the recovered energy to the logic stages.

28. A logic circuit as claimed in claim 1 wherein each transistor in each logic stage is coupled directly across the power supply through capacitance.

29. A logic circuit as claimed in claim 28 wherein the capacitance is parasitic capacitance of the transistor.

30. A logic circuit as claimed in claim 1 wherein energy losses with both charging and discharging of transistor output parasitic capacitance of the logic stages are reduced.

31. A logic circuit comprising:
a power supply which applies a single alternating voltage to a plurality of successive logic stages; and
said plurality of successive logic stages, the logic stages switching states in synchronization with the supply such that changing voltage levels within the logic stages closely follow changes in voltage of the supply to reduce energy losses due to voltage changes across capacitances in the logic circuit.

32. A logic circuit as claimed in claim 31 comprising an inductor for storing energy recovered from the logic stages and returning most of the recovered energy to the logic stages.

33. A logic circuit as claimed in claim 31 wherein each transistor in each logic stage is coupled directly across the power supply through capacitance.

34. A logic circuit comprising:
a plurality of successive logic stages; and
a power supply which applies a common alternating voltage to the plurality of successive logic stages, said plurality of successive logic stages being alternately activated by the alternating voltage in logical processing of respective inputs, the power supply storing energy recovered from the logic stages and returning most of the recovered energy to the logic stages.

35. A logic circuit as claimed in claim 34 wherein the logic stages are active during respective rising and falling portions of the power supply waveform.

36. A logic circuit as claimed in claim 34 wherein successive logic stages comprise switchable semiconductor devices of opposite conductivity types.

37. A logic circuit as claimed in claim 34 further comprising means for precharging each logic stage during portions of the power supply waveform during which the stages are not active in logical processing.

38. A logic circuit as claimed in claim 37 wherein the output of each logic stage is precharged by an input device of each next stage.

39. A logic circuit as claimed in claim 34 wherein logic stages comprise basic logic elements, a basic logic element comprising:
an input transistor coupled to conduct between a first precharged capacitor and the power supply;
a second transistor coupled to conduct between a second precharged capacitor and the power supply, the second transistor being inhibited by a change in charge on the first capacitor due to conduction through the input transistor; and
means for precharging the precharged capacitors when the stage is not active in logical processing.

40. A logic circuit as claimed in claim 39 further comprising a second input transistor coupled to conduct between the first precharged capacitor and the power supply.

41. A logic circuit as claimed in claim 39 further comprising plural basic logic elements coupled in parallel to drive a common output.

42. A logic circuit as claimed in claim 39 wherein a register stage comprises successive logic stages, the first logic stage comprising first and second selector circuits the first selector circuit selecting an external input to the register stage and the second selector circuit selecting an output from the second logic stage as an input to the first logic stage, each selector circuit comprising a basic logic element having first and second input transistors coupled in parallel to conduct between the first precharged capacitor and the power supply.

43. A logic circuit as claimed in claim 34 further comprising an inductor coupled across the alternating voltage of the power supply in parallel with the successive logic stages such that the inductor and logic stages resonate to appear as a high impedance across the alternating voltage power supply.

44. A logic circuit as claimed in claim 43 wherein the inductor and successive logic stages are formed on a common semiconductor chip.

45. A logic circuit as claimed in claim 43 wherein logic stages are formed on a plurality of chips which are clustered in a module with a common power supply.

46. A logic circuit as claimed in claim 34 wherein the logic stages are formed on a semiconductor chip having a power supply connection on a surface of the chip opposite to a surface of the chip on which logic interconnections are formed.

47. A logic circuit as claimed in claim 34 comprising an inductor for storing energy recovered from the logic stages and returning most of the recovered energy to the logic stages.

48. A logic circuit comprising:
a power supply which applies a common alternating voltage to a plurality of successive logic stages; and
said plurality of successive logic stages, the successive logic stages being alternately activated by the power supply in logical processing of respective inputs during respective rising and falling portions of the power supply waveform, the successive logic stages switching states in synchronization with the supply such that changes in voltage levels within the logic stages closely follow changes in voltage of the supply to reduce capacitive charging and discharging energy loss in the logic circuit, successive stages being of switchable semiconductor devices of opposite conductivity types, each logic stage being precharged during the portions of the power supply during which the logic stage is not active in logical processing.

49. A logic circuit as claimed in claim 48 wherein the output of each logic stage is precharged by an input device of each next stage.

50. A logic circuit as claimed in claim 48 wherein logic stages comprise basic logic elements, a basic logic element comprising:
an input transistor coupled to conduct between a first precharged capacitor and the power supply;
a second transistor coupled to conduct between a second precharged capacitor and the power supply, the second transistor being inhibited by a change in charge on the first capacitor due to conduction through the input transistor; and
a device for precharging the first precharged capacitor when the stage is not active in logical processing.

51. A logic circuit as claimed in claim 48 further comprising an inductor coupled across the alternating voltage of the power supply in parallel with the successive logic stages such that the inductor and logic stages resonate to appear as a high impedance across the alternating voltage power supply.

52. A logic circuit as claimed in claim 48 comprising an inductor for storing energy recovered from the logic stages and returning most of the recovered energy to the logic stages.

53. A method of processing in a logic circuit comprising:
applying an alternating voltage to a plurality of successive logic stages, the power supply storing energy recovered from the logic stages and returning most of the recovered energy to the logic stages;
during a first portion of the power supply waveform, precharging a first set of alternative logic stages and performing logical processing of respective inputs of a second set of alternate logic stages; and
during a second portion of the power supply waveform, precharging the second set of logic stages and logically processing respective inputs to the first set of logic stages.

54. A method as claimed in claim 53 wherein the first and second portions are respectively the rising and falling portions of the alternating voltage.

55. A method as claimed in claim 53 wherein the first and second sets of logic stages respond alternately to the alternating voltage of the power supply due to use of devices of opposite conductivity types.

56. A method as claimed in claim 53 further comprising transferring energy between the logic stages and a resonant inductor coupled across the power supply.

57. A method as claimed in claim 53 wherein the recovered energy is stored in an inductor.

* * * * *